US010650106B2

(12) United States Patent
Bell et al.

(10) Patent No.: US 10,650,106 B2
(45) Date of Patent: May 12, 2020

(54) CLASSIFYING, SEPARATING AND DISPLAYING INDIVIDUAL STORIES OF A THREE-DIMENSIONAL MODEL OF A MULTI-STORY STRUCTURE BASED ON CAPTURED IMAGE DATA OF THE MULTI-STORY STRUCTURE

(71) Applicant: Matterport, Inc., Mountain View, CA (US)

(72) Inventors: Matthew Tschudy Bell, Palo Alto, CA (US); Haakon Erichsen, Asker (NO); Mykhaylo Kurinnyy, Milpitas, CA (US)

(73) Assignee: Matterport, Inc., Mountain View, CA (US)

( * ) Notice: Subject to any disclaimer, the term of this patent is extended or adjusted under 35 U.S.C. 154(b) by 352 days.

(21) Appl. No.: 15/009,330

(22) Filed: Jan. 28, 2016

(65) Prior Publication Data
US 2016/0217225 A1    Jul. 28, 2016

Related U.S. Application Data

(60) Provisional application No. 62/109,023, filed on Jan. 28, 2015.

(51) Int. Cl.
*G06G 7/48* (2006.01)
*G06F 17/50* (2006.01)
(52) U.S. Cl.
CPC ............................... *G06F 17/5004* (2013.01)
(58) Field of Classification Search
None
See application file for complete search history.

(56) References Cited

U.S. PATENT DOCUMENTS

| 7,567,844 B2* | 7/2009 | Thomas | G05B 15/02 348/143 |
| 8,464,181 B1* | 6/2013 | Bailiang | G06F 3/04815 715/848 |

(Continued)

OTHER PUBLICATIONS

Niederauer, Christopher, et al. "Non-invasive interactive visualization of dynamic architectural environments." Proceedings of the 2003 symposium on Interactive 3D graphics. ACM, 2003.*

(Continued)

*Primary Examiner* — Rehana Perveen
*Assistant Examiner* — Nithya J. Moll
(74) *Attorney, Agent, or Firm* — Ahmann Kloke LLP

(57) ABSTRACT

Systems and methods are provided for automatically separating and reconstructing individual stories of a three-dimensional model of a multi-story structure based on captured image data of the multi-story structure. In an aspect, a system is provided that includes an analysis component configured to analyze a three-dimensional model of structure comprising a plurality of stories generated based on captured three-dimensional image data of the structure and identify respective stories of the plurality of stories to which features of a three-dimensional model are associated. The system further includes a separation component configured to separate the respective stories from one another based on the features respectively associated therewith, and an interface component configured to generate a graphical user interface that facilitates viewing the respective stories as separated from one another.

31 Claims, 16 Drawing Sheets

(56) References Cited

U.S. PATENT DOCUMENTS

| | | | |
|---|---|---|---|
| 2005/0081161 A1* | 4/2005 | MacInnes | G06F 17/5004 |
| | | | 715/765 |
| 2005/0177350 A1 | 8/2005 | Kishikawa | |
| 2008/0088621 A1* | 4/2008 | Grimaud | G06T 19/00 |
| | | | 345/421 |
| 2010/0066559 A1 | 3/2010 | Judelson | |
| 2012/0209574 A1* | 8/2012 | Moreau | G06F 17/50 |
| | | | 703/1 |
| 2013/0155058 A1 | 6/2013 | Golparvar-Fard et al. | |
| 2013/0222373 A1 | 8/2013 | Weinstein et al. | |
| 2013/0281111 A1 | 10/2013 | Syrjarinne et al. | |
| 2013/0342533 A1 | 12/2013 | Bell et al. | |
| 2014/0163931 A1 | 6/2014 | Snyder et al. | |
| 2014/0245232 A1 | 8/2014 | Bailiang | |

OTHER PUBLICATIONS

International Search Report and Written Opinion for International Application Serial No. PCT/US16/15420, dated Apr. 7, 2016, 32 pages.

Extended European Search Report received for EP Patent Application Serial No. 16744128.6 dated Aug. 22, 2018, 9 pages.

Oesau et al., "Indoor Scene Reconstruction using Feature Sensitive Primitive Extraction and Graph-cut", ISPRS Journal of Photogrammetry and Remote Sensing, vol. 90, 2014, pp. 68-82.

Huber et al., "Methods for automatically modeling and representing as-built building information models", Proceedings of 2011 NSF Engineering Research and Innovation Conference, Atlanta, Georgia, 2011, 8 pages.

* cited by examiner

CLASSIFYING, SEPARATING AND DISPLAYING INDIVIDUAL STORIES OF A THREE-DIMENSIONAL MODEL OF A MULTI-STORY STRUCTURE BASED ON CAPTURED IMAGE DATA OF THE MULTI-STORY STRUCTURE

RELATED APPLICATION

This application claims priority to U.S. Provisional Patent Application No. 62/109,023 filed on Jan. 28, 2015, and entitled "CLASSIFYING, SEPARATING AND DISPLAYING INDIVIDUAL STORIES OF A THREE-DIMENSIONAL MODEL OF A MULTI-STORY STRUCTURE BASED ON CAPTURED IMAGE DATA OF THE MULTI-STORY STRUCTURE." The entirety of the aforementioned application is incorporated by reference herein.

TECHNICAL FIELD

This application generally relates to systems and methods for automatically classifying, separating and displaying individual stories of a three-dimensional model of a multi-story structure based on captured image data of the multi-story structure.

BACKGROUND

There has been extensive work in the field of interactive, first-person three-dimensional immersive environments in which users are able to walk through a virtual space. The last quarter-century of first-person shooter video games are evidence of and otherwise exemplary of the same.

Complementing and expanding upon this work are various tools for visualizing three-dimensional models of terrain. For example, aerial modeling tools allow users to virtually explore urban areas in three dimensions from an aerial point of view. Panoramic modeling tools such as Google Street View allow users to view multiple 360-degree panoramas of an environment and to navigate between these multiple panoramas with a visually blended interpolation. A more generally applicable variety of three-dimensional modeling tools allow users to view three-dimensional models in an object-centric manner whereby a user may zoom in and out on the model and rotate the same around a desired central point.

It is also becoming more feasible to automatically capture real-world spaces in three dimensions. These captured spaces may then be converted into three-dimensional models. Exemplary tools for such capture include laser scanners, stereo cameras, coordinate measuring technologies, and various other three-dimensional capture devices. With these developments, there is a consequential need to develop and improve techniques for viewing and navigating these three-dimensional models on an array of computing devices.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Figure 1:
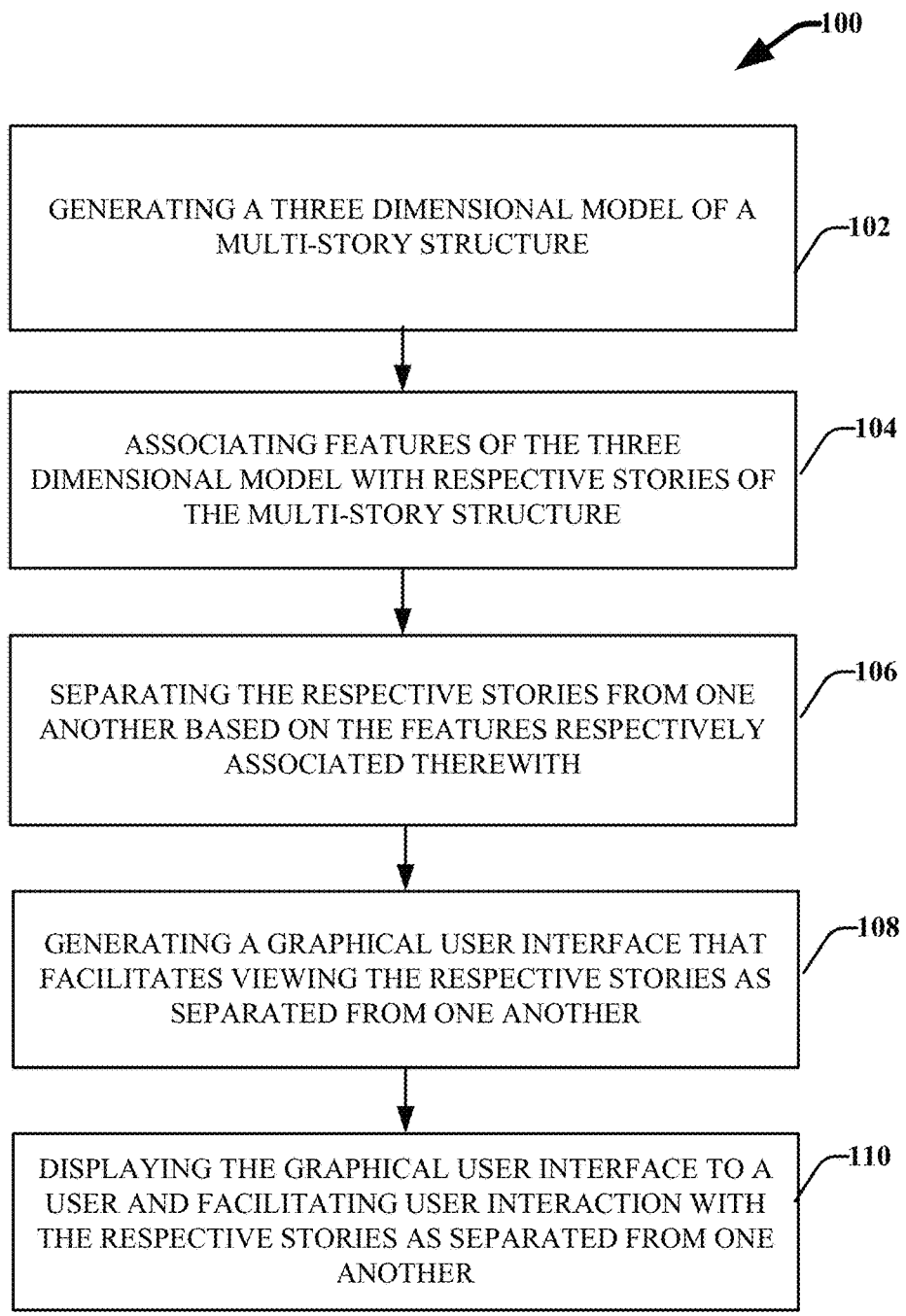
FIG. 1 presents an example process for automatically classifying, separating, and displaying, individual stories of a three-dimensional model of a multi-story structure based on captured image data of the multi-story structure in accordance with various aspects and embodiments described herein.

The innovation is described with reference to the drawings, wherein like reference numerals are used to refer to like elements throughout. In the following description, for purposes of explanation, numerous specific details are set forth in order to provide a thorough understanding of this innovation. It may be evident, however, that the innovation can be practiced without these specific details. In other instances, well-known structures and components are shown in block diagram form in order to facilitate describing the innovation.

Technologies exist for capturing and reconstructing three-dimensional data from an environment such as a building. However, this data is generally unstructured. It is valuable to have this data of a building semantically grouped by story or story with the part of the building belonging to each story classified as such. Furthermore, allowing users to visually see the separation between stories allows them to better understand the space.

By way of introduction, the subject matter described in this disclosure relates to automatically segmenting a set of three-dimensional data corresponding to a model of a three-dimensional multi-story structure into subsets of three-dimensional data respectively corresponding to respective stories of the three-dimensional structure. The subject disclosure further provides systems and methods for generating and displaying a graphical user interface that facilitates viewing and interacting with three-dimensional representations of the respective stories of the three-dimensional structure generated based on the subsets of the three-dimensional data respectively corresponding to the respective stories. For example, the interface can facilitate viewing a three-dimensional representation of an individual story of the multi-story structure as separated or visually distinguished from three-dimensional representations of other stories of the multi-story structure. With this tool, users can easily view different aspects of an entire single story of a multi-story structure from various perspectives and without full or partial occlusion by the other stories of the multi-story structure. The graphical user interface may also facilitate seamlessly navigating between the three-dimensional representations of the respective stories.

As used herein, the term 'story' refers to a level of a building that includes one or more rooms that could be used by people (e.g., for living, work, storage, recreation, etc.). The terms 'floor,' 'level,' or 'deck' can also be used in this sense. The words 'story' and 'floor' also may also include levels of the building that have no roof or ceiling, even if they are used by people, such as the terrace on the top roof of many buildings. The term floor is used herein to refer to the horizontal or substantially horizontal structure of a building upon with people or objects stand. In this sense, each story of a building includes a floor.

In one or more embodiments, a system is disclosed that includes a memory that stores computer executable components and a processor that executes at least the computer executable components stored in the memory. These components include an analysis component configured to analyze a three-dimensional model of a structure comprising different stories generated based on captured three-dimensional image data of the structure, and identify features of the three-dimensional-model respectively associated with each of the different stories. For example, the features can include surfaces of the three-dimensional model, including floors, walls and ceilings. The features can also include geometric components of the three-dimensional model, including but not limited to, polygons, triangles, quads, and/or n-gon, or non-uniform rational basis splines (NURBS), (e.g., wherein the three-dimensional model includes a three-dimensional mesh). In another example, the features can include structural components, fixtures, and freestanding objects associated with the three-dimensional model.

The system further includes a separation component configured to separate the different stories from one another based on the features respectively associated therewith, and an interface component configured to generate a graphical user interface that facilitates viewing representations of the different stories as visually distinguished from one another. In various implementations, the system further includes an interaction component configured to receive input identifying a selected story of the different stories, wherein in response to the input, the interface component is configured to display a representation of the selected story in the graphical user interface such that it is visually distinguished from one or more representations of unselected stories of the different stories. The system can also include a presentation component configured to present the graphical user interface on a device display.

In one implementation, the interface component is configured to visually distinguish the representation of the selected story in the graphical user interface by excluding the one or more representations of the unselected stories from the graphical user interface. In another implementation, the interface component is configured to visually distinguish the representation of the selected story in the graphical user interface by including the one or more representations of the unselected stories in the graphical user interface and displaying the representation of the selected story in a different color relative to the one or more representations of the unselected stories. In yet another implementation, the interface component is configured to visually distinguish the representation of the selected story in the graphical user interface by including the one or more representations of the unselected stories in the graphical user interface and causing the one or more representations of the unselected stories to appear transparent or partially transparent. Still in yet another implementation, the interface component is configured to visually distinguish the representation of the selected story in the graphical user interface by including the one or more representations of the unselected stories in the graphical user interface and spatially separating the representation of the selected story from the one or more representations of the unselected stories.

Other embodiments are directed to a method using a processor to execute computer executable instructions stored in a memory to perform various acts. These acts include analyzing a three-dimensional model of structure comprising a plurality of stories generated based on captured three-dimensional image data, including: identifying horizontal surfaces of the three-dimensional model, identifying a subset of the horizontal surfaces corresponding to floors based on a size, shape or geometric relationship of the horizontal surfaces, and determining respective stories of the plurality of stories that each of the floors are associated with based on a geometric relationship between each of the floors. The method further includes classifying geometric components of the three-dimensional model as belonging to the respective stories based on the analyzing. In one or more implementations, the method further includes ordering the respective stories based on a geometric relationship between the floors.

In one embodiment, the analyzing further includes clustering subsets of the horizontal surfaces into clusters based on a size, shape or geometric relationship of the horizontal surface, and determining respective clusters of the clusters that are associated with the respective stories based on a geometric relationship between the clusters. According to this embodiment, the analyzing further includes identifying non-horizontal surfaces of the three-dimensional model, and determining subsets of the non-horizontal surfaces respectively associated with the respective stories based on a geometric relationship between the subsets of the non-horizontal surfaces and the subsets of the horizontal surfaces respectively associated with each of the clusters.

In another embodiment, the method further includes generating separate three-dimensional representations of the respective stories based on the geometric components belonging to the respective stories. With this embodiment, the method further includes receiving input identifying a selected story of the respective stories, and generating a graphical user interface including a three-dimensional representation of the selected story that is visually distinguished from one or more three-dimensional representations of unselected stories of the respective stories. The graphical user interface is further displayed on a device display in some implementations.

Various additional embodiments are directed to a computer readable storage device comprising executable instructions that, in response to execution, cause a device comprising a processor to perform operations. These operations include analyzing a three-dimensional model of a structure comprising different stories generated based on captured image data of the structure, identifying geometric components of the three-dimensional-model respectively associated with each of the different stories, and separating the different stories from one another based on the geometric components respectively associated therewith. The operations further include receiving input identifying a selected story of the different stories, and generating, based on the receiving the input, a graphical user interface comprising a representation of the selected story that is visually distinguished from one or more representations of unselected stories of the different stories. In one or more implementations, the operations for identifying the geometric components include identifying horizontal surfaces of the three-dimensional model, identifying a subset of the horizontal surfaces corresponding to floors based on a size, shape or geometric relationship of the horizontal surfaces, determining respective stories of the different stories that each of the floors are associated with based on a geometric relationship between each of the floors, and ordering the stories based on a geometric relationship between the floors.

Referring now to the drawings, with reference initially to FIG. 1, presented is a high level diagram of an example process for automatically separating and reconstructing individual stories of a three-dimensional model of a multi-story structure based on captured image data of the multi-story structure in accordance with various aspects and embodiments described herein. Aspects of systems, apparatuses or processes explained in this disclosure can constitute machine-executable components embodied within machine(s), e.g., embodied in one or more computer readable mediums (or media) associated with one or more machines. Such components, when executed by the one or more machines, e.g., computer(s), computing device(s), virtual machine(s), etc. can cause the machine(s) to perform the operations described.

At 102, a three-dimensional model of a multi-story structure is generated. For example, the three-dimensional model can include the surfaces and contents of a building that has multiple stories (e.g., a three story house, a 50 story office building, etc.). The three-dimensional model however is not a two-dimensional computed aided design (CAD) drawing of a proposed structure. On the contrary, it is model of an existing structure generated based on captured three-dimensional data of the structure via a three-dimensional capture device.

At 104, features of the three-dimensional model are associated with respective stories of the three-dimensional model. For example, features such as walls, floors, ceilings, doors, furniture, etc. may be automatically classified as belonging to specific stories of the three-dimensional model. In another example, when the three-dimensional model includes a three-dimensional mesh, the features can include components of the three-dimensional mesh, including but not limited to polygons, triangles, quads, and/or n-gons, or non-uniform rational basis splines (NURBS), collectively referred to herein as geometry data. At 106, the respective stories are separated from one another based on the features respectively associated therewith. At 108, a graphical user interface that facilitates a view of the respective stories as separated from one another is generated (e.g., based on the feature classifications for the respective stories). At 110, the graphical user interface is displayed to a user in a manner/configuration that facilitates interaction with the respective stories as separated from one another.

Figure 2:
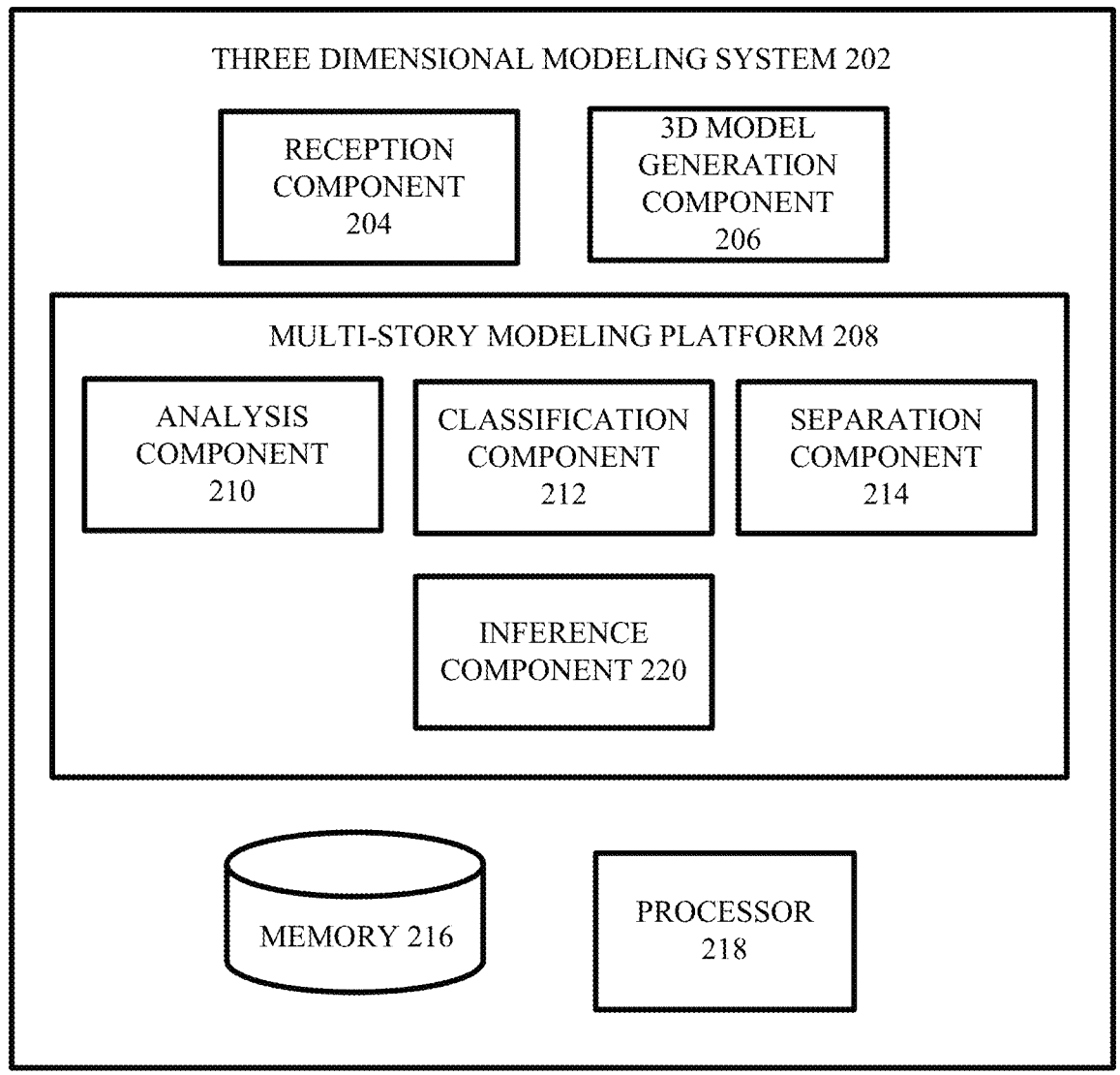
FIG. 2 illustrates an example system for automatically separating and displaying individual stories of a three-dimensional model of a multi-story structure based on captured image data of the multi-story structure in accordance with various aspects and embodiments described herein.

FIG. 2 presented is a diagram of an example three-dimensional modeling system 202 for automatically separating individual stories of a three-dimensional model of a multi-story structure based on captured image data of the multi-story structure in accordance with various aspects and embodiments described herein.

Three-dimensional modeling system 202 includes reception component 204, three-dimensional model generation component 206, and multi-story modeling platform 208. System 202 can further include memory 216 for storing computer executable components and instructions and processor 218 to facilitate operation of the instructions (e.g., computer executable components and instructions) by the three-dimensional modeling system 202.

In an aspect, reception component 204 is configured to receive a three-dimensional model of an object or environment (e.g., from another device via a network or a wireless communication). For purposes of the subject disclosure, the object or environment includes a structure or building that has two or more stories, referred to herein as a multi-story structure. In other aspects, three-dimensional models of various multi-story structures are retained by three-dimensional modeling system 202 in memory 216.

The three-dimensional model(s) generally include one or more meshes of triangles, quads, and/or n-gons. The three-dimensional model(s) can also include curved surfaces such as NURBS, which are a function of two parameters mapped to a common surface area in three-dimensional space. In some aspects, the three-dimensional model(s) can have associated color or material properties. For example, each vertex of a mesh can contain associated texture data in one or more separate images via UV mapping. Examples of common three-dimensional model formats include ".obj", ".fbx", and ".dae." The three-dimensional model(s) can also be associated metadata, some of which may be tied to specific sets of coordinates. For example, this metadata can contain a name for a model, information about when, where, by whom, and with what hardware, the model was captured. The metadata can also contain annotations tied to specific locations, areas, or volumes on or around the model, as well as measurements of dimensions on or around the model. However, this metadata may not include information that correlates the various features or points in the three-dimensional model to the respective stories of the multi-story structure with which they are associated.

In another aspect, reception component 204 is configured to receive three-dimensional data of an environment or object that has been captured by a three-dimensional capture device. In accordance with this aspect, the three-dimensional model generation component can 206 employ this three-dimensional data to generate a three-dimensional model of the multi-story structure. For example, the three-dimensional data can include information about the position and appearance of objects in a physical space, including the various objects or features that form a multi-story structure as well as the objects and features provided on the exterior and/or within the interior of the multi-story structure. The three-dimensional data can also include information regarding the position and/or orientation of the capture device. In another example, the three-dimensional data can include one or both of geometry and appearance information from points and/or regions of the multi-story structure.

Examples of three-dimensional capture devices include but are not limited to: LIDARs, hand-held laser line scanners, structured light projectors paired with cameras such as the Microsoft® Kinect, other structured light systems, stereo cameras with software for depth derivation, stereo cameras paired with pattern projection systems as well as software for depth derivation, time-of-flight cameras, video cameras capable of structure-from-motion calculations, and lightfield cameras. Multiple capture devices may be combined or a capture device may be paired with a color camera to provide color detail for the captured information.

Inference component 220 is configured to provide for or aid in various inferences or determinations associated with aspects of multi-story modeling platform. For example inference component 220 can facilitate analysis component 210 with inferring what respective stories feature or objects (e.g., structures, walls, components of a three-dimensional mesh, clusters of three-dimensional point clouds, etc.) of a three-dimensional model of a multi-story structure are included in. In another example, inference component 220 can facilitate separation component 214 with separating the feature data corresponding to the respective stories, and/or when adjusting interfaces between the respective stories.

In order to provide for or aid in the numerous inferences described herein, inference component 220 can examine the entirety or a subset of the data to which it is granted access and can provide for reasoning about or infer states of the system, environment, etc. from a set of observations as captured via events and/or data. An inference can be employed to identify a specific context or action, or can generate a probability distribution over states, for example. The inference can be probabilistic—that is, the computation of a probability distribution over states of interest based on a consideration of data and events. An inference can also refer to techniques employed for composing higher-level events from a set of events and/or data.

Such an inference can result in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines, etc.) can be employed in connection with performing automatic and/or inferred action in connection with the claimed subject matter.

A classifier can map an input attribute vector, x=(x1, x2, x3, x4, xn), to a confidence that the input belongs to a class, such as by f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hyper-surface in the space of possible inputs, where the hyper-surface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

Figure 3:
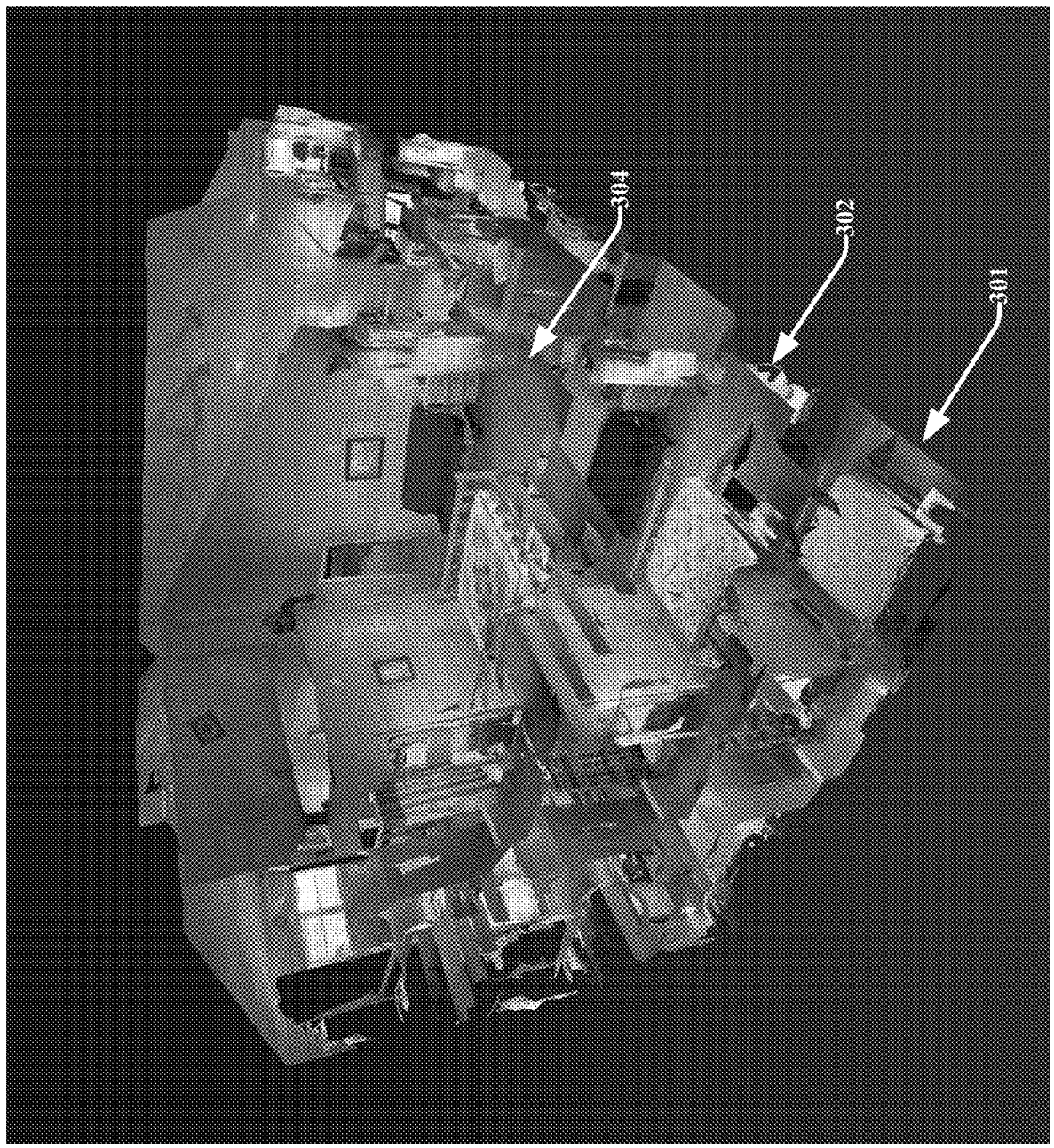
FIG. 3 presents an example system for automatically separating and displaying individual stories of a three-dimensional model of a multi-story structure based on captured image data of the multi-story structure in accordance with various aspects and embodiments described herein.

FIG. 3 presents an example three-dimensional model 300 of a multi-story structure in accordance with various aspects and embodiments disclosed herein. Model 300 presents a three-dimensional representation of an interior of a three story building with at least a portion of all the stories rendered. For example, arrow 301 identifies a story of the first or lowest story, arrow 302 identifies a story of the second or middle story, and arrow 04 identifies a story of the third or highest story.

Three-dimensional model 300 presents a perspective of the multi-story structure from the outside looking in certain parts removed (e.g., via backface culling), a view referred to herein as the orbit view. As can be noticed when viewing model 300, when looking at a three-dimensional model in orbit view, it is difficult to distinguish the different stories. It also difficult (or impossible) to see all the stories completely because some upper stories block the view from portions of the lower stories and vice versa. It can be and even more difficult to distinguish which features go with which stories. Accordingly, as discussed in greater detail infra, techniques are disclosed for automatically separating the respective stories 301, 302 and 304 from one another and rending various perspective views of the respective stories individually.

Referring back to FIG. 2, in accordance with an embodiment, multi-story modeling platform 208 is configured to automatically determine the respective stories of a multi-story structure with which the various features or points in a three-dimensional model of the multi-story structure are associated. In particular, multi-story modeling platform 208 can employ analysis component 210 to analyze a three-dimensional model of multi-story structure and to automatically determine or infer which stories the various features or objects of the three-dimensional model are respectively associated with. These features or objects can include but are not limited to structural components (e.g., floors, walls, ceilings, doors doorways, beams, balconies, stairs, etc.), fixtures (e.g., lights, ceiling fans, molding, flooring, etc.), chattels (e.g., furniture, appliances, movable or freestanding objects, etc.), and geometrical components of the 3D model (e.g. triangles, quads, n-gons, NURBS, points).

In another aspect, analysis component 210 may be configured to analyze received three-dimensional data captured for a multi-story structure prior to generation of a three-dimensional model for the multi-story structure using the data. For example, analysis component 210 can analyze three-dimensional feature information (e.g., spatial and appearance information) for captured point clouds of the multi-story structure to identify objects represented by the point clouds and respective stories of the multi-story structure which the objects are included. In other aspects, analysis component 210 can analyze both a three-dimensional model of a multi-story structure and raw-three-dimensional data captured of the multi-story structure that was employed to generate the three-dimensional model to determine which stories the respective objects/features of the three-dimensional model are associated with.

Classification component 212 is configured to classify the respective features/objects of a three-dimensional model of multi-story structure based on the story to which the respective features/objects belong as determined or inferred by analysis component 210. For example, classification component 212 can generate an index that identifies respective features/objects included in a three-dimensional model of a multi-story structure and associates each of the features with the story to which they belong. In an aspect, the features/objects can be identified as the objects the actual objects represent (e.g., door 1-story 1, door 2-story 1, bed 1-story 4, etc.). In another aspect, the objects or features can be identified by a generic naming system (e.g., objects 1-44, story 1, objects 45-78-story 2, objects 79-155-story 4, etc.). For example, these objects can include geometrical components, such as identified polygons, triangles, quads, and/or n-gons, or non-uniform rational basis splines (NURBS), included in the three-dimensional model of the multi-story structure (e.g., the model is a three-dimensional mesh). Still in yet another aspect, the objects/features can be associated with coordinates and grouped to their respective stories based on their respective coordinates falling within a coordinate boundary area corresponding to the respective stories.

It should be appreciated that story classifications may not be exclusive. For example, classification component can classify features/objects and/or portions of the features/objects as belonging to two or more stories. For example, the stairs and walls of a staircase connecting story 1 with story 2 may be classified as belonging to both story 1 and story 2. In another example, a top portion of the stairs connecting story 1 with story 2 can be classified as belonging to story 2 while a bottom portion of the stairs can be classified as belonging to story 1.

Separation component 214 is configured to separate the respective stories of a three-dimensional model from one another based on the objects/features respectively associated therewith. For example, separation component 214 can generate separate files or data objects for the respective stories that include identifying the respective features/objects included or associated with each of the different stories. The information can also identify the manner in which the story is arranged (e.g., an order of the respective stories). These files or data structures can further be stored in memory 216. In an aspect, separation component 214 can also determine interfaces between the respective stories.

In one embodiment, analysis component 210 is configured to determine or infer which stories features/objects included in a three-dimensional model of, (and/or included in captured three-dimensional data of), a multi-story structure belong or are associated with by identifying areas of the model (or the data) corresponding to horizontal or substantially horizontal surfaces relative to a ground surface. In this sense, the ground surface refers to a solid surface of the earth upon which the multi-story structure is built. For example, these horizontal surfaces can correspond to floors, tabletops, countertops, stair steps, ceilings, or other surfaces.

Analysis component 210 can employ various techniques to identify and characterize the horizontal surfaces included a three-dimensional model and/or three-dimensional data captured for an object such as a multi-story structure. In an aspect, flat surfaces (e.g., walls, floors and/or ceilings) can be identified in captured 3D data or a reconstructed 3D model based on an iterative method such as, for example, RANdom SAmple Consensus (RANSAC). For example, the analysis component 210 can select a certain surface area and/or a certain number of edges, vertices, or triangles that are associated with a common plane. The analysis component 210 can also identify other points, vertices, or triangles that are also associated with the common plane. As such, the analysis component 210 can determine that a common plane is a surface (e.g., a wall, floor or ceiling) in response to a determination that a certain surface area or a certain number of edges, vertices, or triangles are associated with the common plane. Furthermore, the analysis component 210 can remove geometry associated with the common plane from a set of geometry being considered for identification as a plane. The analysis component 210 can repeat this process to identify other planes (e.g., other walls, floor or ceilings) in captured 3D data or a reconstructed 3D model. Additionally or alternatively, the analysis component 210 can identify flat surfaces (e.g., walls, floors and/or ceilings) in captured 3D data based on a non-iterative method.

Horizontal floor surfaces may be distinguished from other flat surfaces via various methods, such as the orientation of the common plane associated with the surface being within a threshold of horizontal, or the average normal vector of the 3D data classified as a surface being within a threshold of upwardly vertical.

The analysis component 210 can additionally determine an estimate of a surface fit associated with a particular portion of the captured 3D data. Based on the surface fit associated with the particular portion of the captured 3D data, the analysis component 210 can identify a greater portion of the captured 3D data (e.g., the analysis component 210 can implement a region growing technique). For example, the analysis component 210 can add other portions of the captured 3D data associated with the particular portion of the captured 3D data (e.g., neighboring portions of data) based on one or more criteria, such as but not limited to, an orientation of another portion of the captured 3D data being close to an orientation of the estimate of the surface fit associated with the particular portion of the captured 3D data, a normal vector of another portion of the captured 3D data being close to a normal vector of the estimate of the surface fit associated with the particular portion of the captured 3D data, the distance from another portion of the captured 3D data to the particular portion of the captured 3D data being under a threshold level, etc. The analysis component 210 can reject other portions of captured 3D data if the other portions of the captured 3D data are determined to not fit (e.g., sufficiently fit) the plane. Furthermore, the analysis component 210 can update a surface model (e.g., a least-squares fit or a covariance matrix) as other portions of the captured 3D data (e.g., new portions of the captured 3D data) are identified as belonging to a corresponding surface (e.g., the same surface).

In an aspect, the analysis component 210 can reclassify (e.g., merge, combine, etc.) portions of the captured 3D data (e.g., captured regions of a 3D model) that are identified as flat surfaces. For example, the analysis component 210 can reclassify (e.g., merge, combine, etc.) portions of the captured 3D data that are identified as flat surfaces based on distance criteria and/or orientation criteria. Distance criteria can include, but are not limited to, a determination that portions of the captured 3D data that are identified as flat surfaces overlap, that portions of the captured 3D data that are identified as flat surfaces are contiguous (e.g., connected, touching, etc.), that distance between an edge of a particular portion of the captured 3D data and an edge of another portion of the captured 3D data is below a threshold level, etc. Orientation criteria can include, but are not limited to, a determination that orientation and/or normal vectors of portions of the captured 3D data differ by less than a certain threshold level, that a mean-squared error of a surface fit to a particular portion of the captured 3D data and another portion of the captured 3D data is less than a certain threshold level, etc. In an aspect, the analysis component 210 reclassifies (e.g., merges, combines, etc.) portions of the captured 3D data that are identified as flat surfaces in response to a determination that the portions of the captured 3D data are associated with a common subsection of a 3D model (e.g., a common room), and does not reclassify portions of the captured 3D data that are identified as flat surfaces in response to a determination that the portions of the captured 3D data are not associated with a common subsection of a 3D model. Additional information regarding the identification of flat surfaces such as floors and walls, as well as their boundaries, in captured 3D data or reconstructed 3D models, can be found in U.S. application Ser. No. 14/298,370, filed Jun. 6, 2014, and entitled SEMANTIC UNDERSTANDING OF 3D DATA, incorporated herein by reference.

After the horizontal surfaces are identified, analysis component 210 can group the horizontal surface into clusters or groups corresponding to different stories of the multi-story structure, wherein each of the horizontal surfaces included in a cluster or group belong to the same story. In other words, each cluster or group corresponds to horizontal surfaces contained within a single story of the multi-story structure. The analysis component 210 can then determine or infer which stories the remaining features (e.g., the non-horizontal surface features) belong based on their positions relative to the positions of the horizontal surfaces (e.g., the floors and ceilings of the respective stories), included within the respective clusters.

In an aspect, the analysis component 210 is configured to determine what stories identified horizontal surfaces respectively belong by identifying a lowest horizontal surface (relative to the ground) in the entire three-dimensional model and associating it with a group or cluster corresponding to the lowest story. For example, analysis component 210 can determine the vertical positions of each of the horizontal surfaces and order the horizontal surfaces from lowest to highest. (It is to be appreciated that some of the horizontal surfaces can be substantially coplanar. In this scenario, the surfaces may receive a same order/position). Analysis component 210 can thus easily identify the horizontal surface with the lowest vertical position.

Analysis component 210 can then iteratively examine the remaining horizontal surfaces in vertical order from lowest to highest. In each iteration, the new lowest unclassified horizontal surface is added to the highest existing story if it either does not overlap vertically with any of the other horizontal surfaces in the existing story, or overlaps with a horizontal surface in the highest existing story but is less than a threshold vertical distance above it. (Thus, for example, a table surface would be grouped with the floor the table is standing on, but the floor of the next story up would not). In an aspect, if the new lowest unclassified horizontal surface is more than a threshold distance above a vertically overlapping horizontal surface belonging to the highest identified story, then it is added to a new story that is one story higher than the previous highest identified story. The analysis component 210 can continue this classification process until all the horizontal surfaces have been grouped by story.

In accordance with an aspect of this process, analysis component 210 can specifically identify and cluster horizontal surfaces which constitute floors of the respective stories. In order to identify and classify floors, the analysis component 210 can ignore horizontal surfaces below a certain absolute or relative size. For example, analysis component 210 can essentially identify respective floors and raised platforms which make up interfaces between the different stories. Accordingly, analysis component 210 can restrict evaluation of horizontal surfaces to only those larger than a minimum area (determined based on an estimated minimum area which could constitute a floor) for the particular multi-story structure being evaluated. In another aspect, the analysis component 210 can consider disconnected horizontal surfaces of similar height as a single large surface, or surfaces that are near classified surfaces may be considered for classification before ones that are not. In another aspect, analysis can merge potential stories below a particular absolute or relative size with an adjacent story.

In yet another aspect, analysis component 210 can specifically identify and classify flat surfaces corresponding to walls. For example, analysis component 210 can identify features/objects that are perpendicular or substantially perpendicular to the ground and having a minimum size (e.g., particularly height) as walls. Analysis component 210 can further employ these walls to facilitate identifying different stories of a three-dimensional model of a multi-story structure and the respective objects included in or associated with the different stories. For example, analysis component 210 can employ geometric relationships between the respective walls, floors, and other horizontal surfaces to facilitate identifying the different story boundaries and/or create polygons or other shapes corresponding to the possible dimensions of the floor for a particular story. According to this example, polygons can be added that represent an extension of an identified horizontal surface to meet the boundaries of a wall within a threshold horizontal distance.

Once the horizontal surfaces of a three-dimensional model (and/or three-dimensional data) corresponding to a multi-story structure have been clustered into groups corresponding to the different stories of the multi-story structure and the respective floor surfaces have been identified, the remaining features/objects of the three-dimensional model (and/or the three-dimensional data) can be classified. In an aspect, analysis component 210 can determine or infer which stories the non-horizontal features belong by growing the classified clusters/groups of horizontal surfaces corresponding to each story based on respective positions of the unclassified features relative to the positions of the classified horizontal surfaces respectively included in the different clusters/groups. For example, in an iterative process, analysis component 210 can associate three-dimensional objects/features that are connected (e.g., touching) to classified (e.g., wherein classified means the object/feature is assigned to a story) three-dimensional features/objects with the same story classification. According to this example, walls and other objects connected to a floor of a particular story can be added to that story as well because the walls are connected to the floor. The ceiling corresponding to the particular story can also be classified as belonging to that particular story since the ceiling is connected to the tops of the walls. This classification process stops for the particular floor once all previously unclassified connected components are classified. In an aspect, once all the connected parts of the three-dimensional model are classified, the analysis component 210 can assign unclassified parts of the three-dimensional model that are not connected to any of the classified parts with the same classification as the classified part that is nearest to it.

In another embodiment, analysis component 210 is configured to determine or infer which stories features/objects included in a three-dimensional model, (and/or included in captured three-dimensional data), of a multi-story structure belong or are associated with by identifying areas of the model (or the data) corresponding to them by grouping the features/objects into different rooms of the multi-story structure. The analysis component 210 can implement one or more room-segmentation algorithms to determine whether portions of the captured 3D data are associated with a common subsection of a 3D model (e.g., a common room). In one example, a subsection (e.g., a room etc.) can be identified based on a cell and portal method (e.g., a volumetric cell and portal method, portal culling, etc.). For example, a volumetric representation of a 3D model can be employed to facilitate identifying subsections (e.g., rooms, etc.) in the 3D model. Subsections in the 3D model to separate can correspond to cells and separators in the 3D model can correspond to portals. The analysis component 210 can then cluster the rooms into different stories based on connectivity and/or floor height. In an aspect, the techniques applied to group horizontal surfaces into stories can be applied to rooms as well, wherein each of the rooms are treated as separate features/objects of the three-dimensional model.

In an aspect, separation component 214 can adjust the boundaries or borders between areas classified as one story and areas classified as another story to straighten them. This altering can be accomplished by various methods. For example, separation component 214 can repartition the 3D model using data corresponding to boundaries between respective stories along a set of straight lines that are fit to the determined borders between the different stories. Alternately, features of the 3D model may have their associated story reclassified via an energy minimization function that penalizes both the degree of deviation from the original story classification boundary and the degree to which adjacent boundary segments are not parallel.

Figure 4:
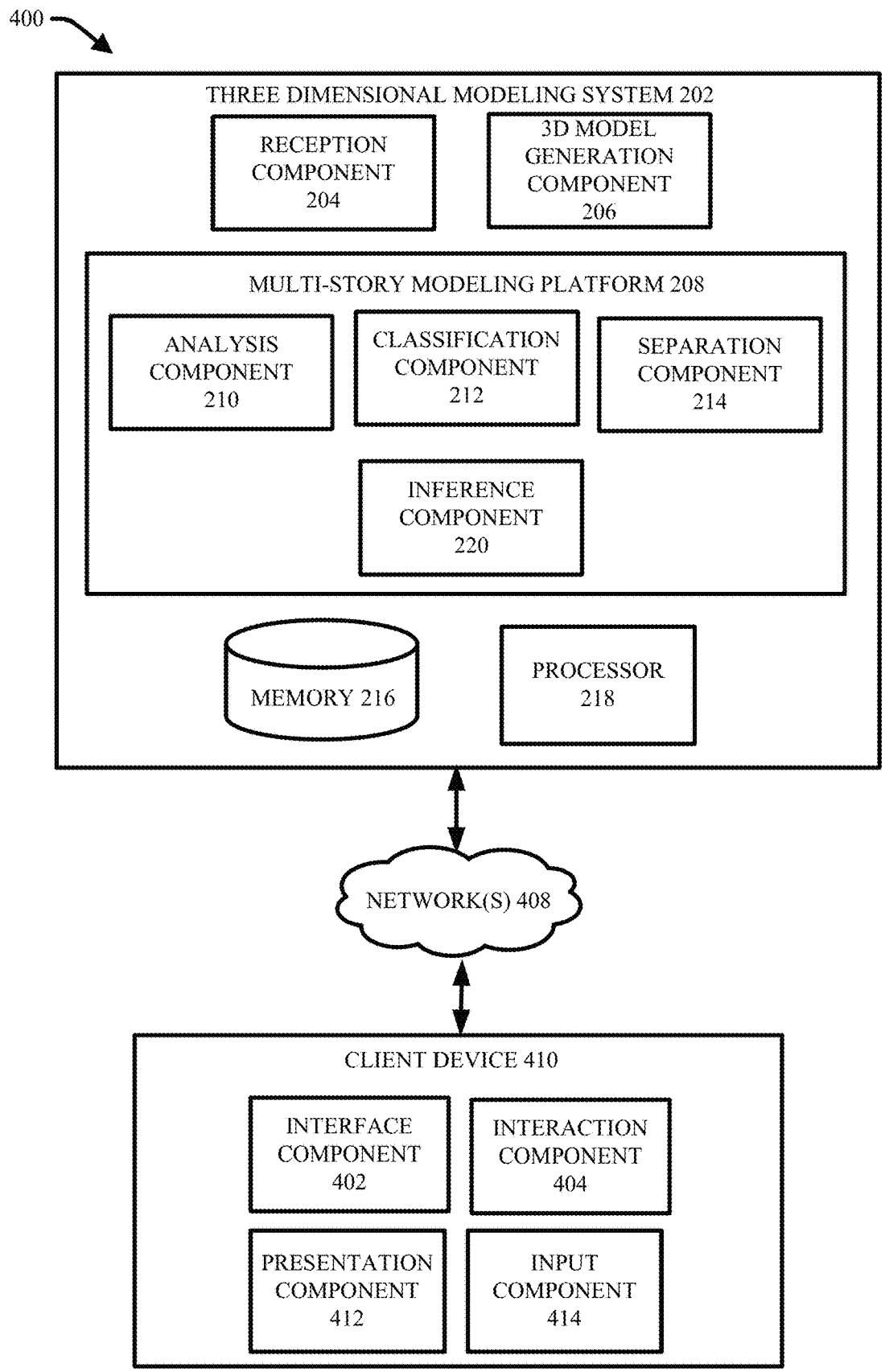
FIG. 4 presents an example graphical user interface that includes a three-dimensional model of a multi-story structure in accordance with various aspects and embodiments described herein.

FIG. 4 presents an example system for automatically separating, classifying and rendering individual stories of a three-dimensional model of a multi-story structure based on captured image data of the multi-story structure in accordance with various aspects and embodiments described herein. System 400 can include one or more of the features and functionalities of system 200. Repetitive description of like elements employed in respective embodiments of systems described herein is omitted for sake of brevity.

System 400 includes one or more networks 408 and a client device 410. Client device 410 includes interface component 402, interaction component 404, presentation component 412 and input component 414. Once the three-dimensional data for a multi-story structure (e.g., the reconstructed three-dimensional features/objects of a three-dimensional model of the multi-story structure and/or the raw three-dimensional data captured of the multi-story structure) has been grouped into different stories, it can be rendered to a user in a way that allows the user to focus on a particular story or stories. In an aspect, the components of client device 410 are configured to facilitate generating a graphical user interface that allows a user to view and navigate about a three-dimensional model of a multi-story structure by separating and reconstructing the stories of the three-dimensional model. For example, individual stories can be viewed one at a time based on user input identifying a story to focus on with the other stories removed or partially removed from view. The graphical user interface can be displayed or presented to the user via a presentation component 412 (e.g., a display device) associated with the client device 410. Input component 414 can facilitate receiving and/or processing user input to facilitate navigating and viewing the three-dimensional model by the user.

In an aspect, as depicted in system 400, client device 410 can access three-dimensional modeling system 202 via one or more networks 408. For example, these networks 408 can include wired and wireless networks, including but not limited to, a cellular network, a wide area network (WAN, e.g., the Internet), a local area network (LAN), or a personal area network (PAN). For example, client device 410 can communicate with three-dimensional modeling system 202 (and vice versa) using virtually any desired wired or wireless technology, including, for example, cellular, WAN, wireless fidelity (Wi-Fi), Wi-Max, WLAN, and etc. In an aspect, one or more components of system 400 are configured to interact via disparate networks. In accordance with this aspect, client device can request and receive a three-dimensional representation of a story of a multi-story structure and the three-dimensional modeling system 202 can stream this three-dimensional representation to the client device prior to generating and streaming three-dimensional representation of other stories included in the multi-story structure (e.g., the client device 410 doesn't have to wait to load/receive three-dimensional representations of all the stories before rendering a single selected story).

Although not depicted, it should be appreciated that other system configurations are suitable with various aspects and embodiments of the subject disclosure. For example, one or more of the components of three-dimensional modeling system 202 can be provided at the client device 410 and (vice versa). In another example, a three-dimensional capturing device (not shown) employed to capture three-dimensional data for a multi-story structure that is used to generate a three-dimensional model of the multi-story structure can be included with client device 410 and/or three-dimensional modeling system 202.

Client device 410 can include any suitable computing device configured to interact with three-dimensional modeling system 202 and generate three-dimensional representations of respective stories of a multi-story structure as separated from one another in accordance with the various aspects and embodiments disclosed herein. For example, client device 410 can include a desktop computer, a laptop computer, a television, an Internet enabled television, a mobile phone, a smartphone, a tablet personal computer (PC), a virtual reality or augmented reality headset, or a personal digital assistant PDA. As used in this disclosure, the terms "content consumer" or "user" refer to a person, entity, system, or combination thereof that employs system 400 (or additional systems described in this disclosure) using a client device 410.

In accordance with an embodiment, interface component 402 is configured to generate various graphical user interfaces that facilitate viewing the respective stories of a three-dimensional model of a multi-story structure as separated from one another. In particular, as discussed infra, analysis component 210, classification component 212, and/or separation component 214 can separate a set of three-dimensional data corresponding to features/objects of a multi-story building into subsets of the three-dimensional data. Each of the subsets (e.g., also referred to herein as groups or clusters) of the three-dimensional data correspond to a different stories of the multi-story structure and respectively include three-dimensional data for the features/objects included in or associated with their corresponding story. In an aspect, the three-dimensional data includes reconstructed data extracted from a three-dimensional model of the multi-story structure. In another aspect, the three-dimensional data includes raw three-dimensional data captured of the multi-story structure by a three-dimensional capture device.

In an aspect, interface component 402 is configured to generate three-dimensional representations of the respective stories of the multi-story structure based on the different subsets or clusters of the three-dimensional data corresponding to the different stories. For example, for each of the different stories, interface component 402 can generate three-dimensional representations of the different stories using the three-dimensional data included in the respective subsets corresponding to the different stories. Each three-dimensional representations of the stories can thus include some or all of the features/objects (structural components, fixtures, freestanding objects, etc.) respectively associated therewith.

In an aspect, interface component 402 is configured to generate a graphical user interface that includes a three-dimensional representation of only a selected story of the respective stories. In another aspect, interface component 402 can generate a graphical user interface that includes three-dimensional representations of different stories (e.g., two or more) of the multi-story structure, respectively, with at least one of the three-dimensional representations corresponding to a selected story(ies) distinguished from the three-dimensional representations of the unselected story(ies). The term 'selected' story is used herein to indicate that a user selected the story to focus. In various aspects, the selected story is also referred to as the 'active' story.

Interface component 402 can employ various techniques to call out or otherwise distinguish stories from one another in a separated manner. FIGS. 5-9 provide example graphical user interfaces generated by interface component that call out and/or otherwise distinguish among respective stories of a three-dimensional model of a multi-story structure. The selected story may be rendered with backface culling or another ceiling removal technique to allow users to view the interior of the story. FIGS. 5-8 and 10 show the multi-story structure 200 depicted in FIG. 2.

Figure 5:
FIG. 5 presents an example graphical user interface that includes a three-dimensional representation of a selected story of a multi-story structure that has been visually called out from three-dimensional representations of other stories of the multi-story structure in accordance with various aspects and embodiments described herein.

In an aspect, interface component 402 can generate a complete view (e.g., a full-color textured model rendered using backface culling) of a three-dimensional representation of a selected story while eliminating (e.g., making invisible or transparent), or making the three-dimensional representations of the other unselected stories nearly transparent or partially transparent (e.g., but not completely invisible or transparent). For example, FIG. 5 presents a perspective view 500 of a three story building with the lowest story active and the upper two stories rendered with a different color scheme, particularly a low alpha and desaturated color. This technique is referred to herein as ghosting. It should be appreciated that various different color schemes aside from those depicted in FIG. 5 can be employed to distinguish the different stories. In another aspect, interface component 402 can generate a complete view (e.g., a textured model rendered using backface culling) of a three-dimensional representation of a selected story in full color while generating the three-dimensional representations of the other stories in wireframe.

Figure 6:
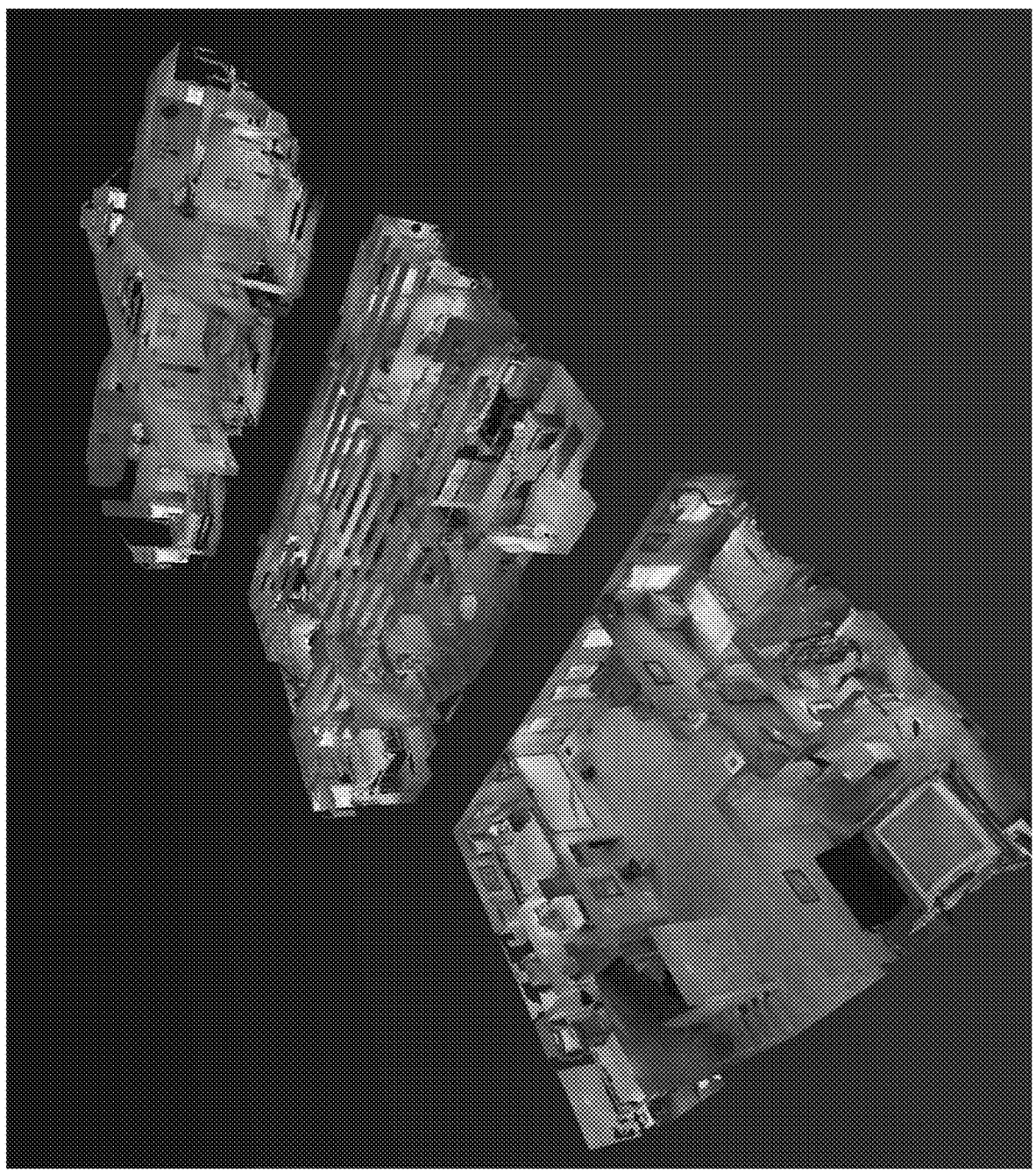
FIG. 6 presents another example graphical user interface that includes a three-dimensional representation of a selected story of a multi-story structure that has been visually called out from three-dimensional representations of other stories of the multi-story structure in accordance with various aspects and embodiments described herein.
Figure 7:
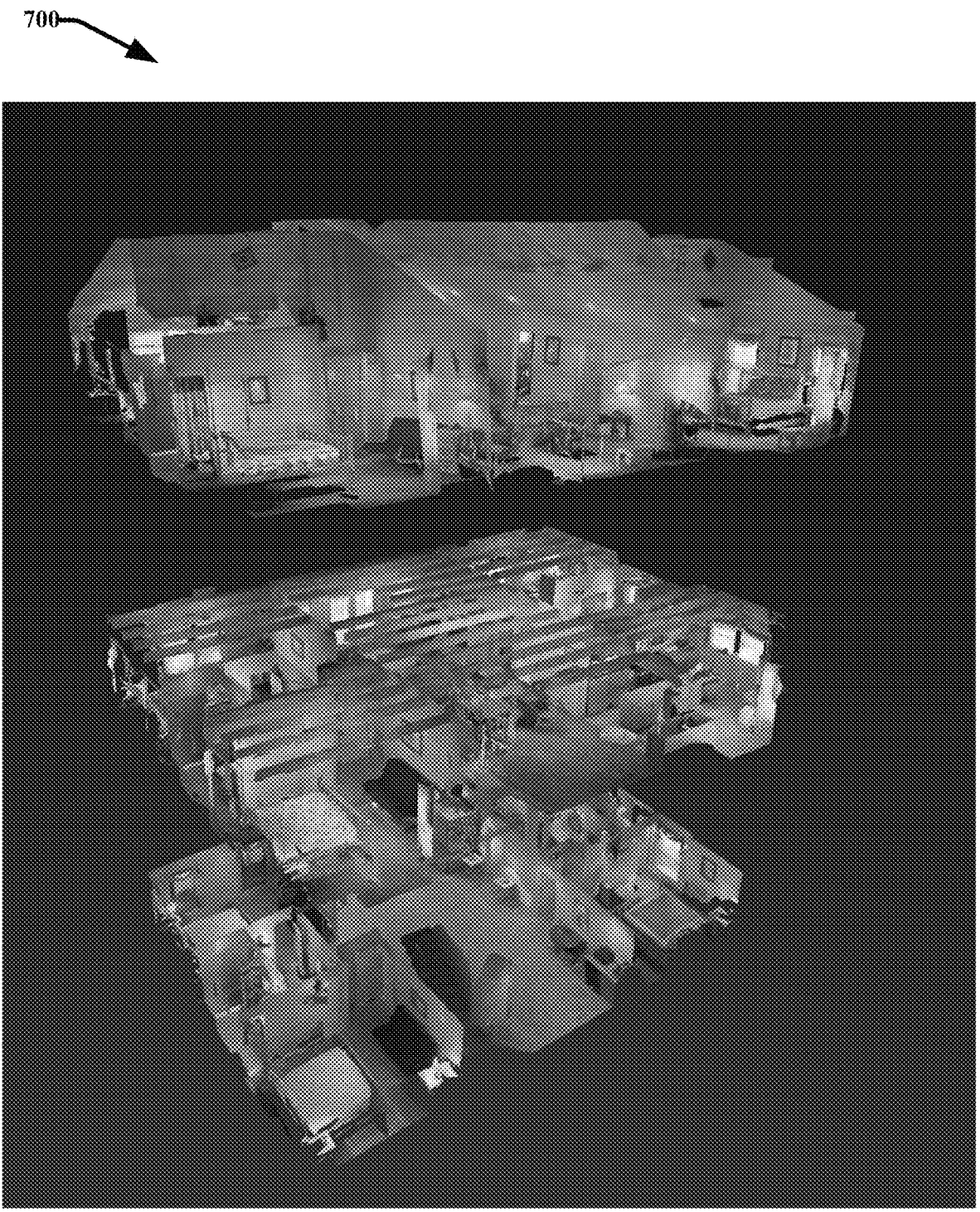
FIG. 7 presents another example graphical user interface that includes a three-dimensional representation of a selected story of a multi-story structure that has been visually called out from three-dimensional representations of other stories of the multi-story structure in accordance with various aspects and embodiments described herein.

In another aspect, interface component 402 can physically separate three-dimensional representations of the different stories from one another by moving them in different directions relative to one another (e.g., in the X direction, the Y direction, the Z direction, or a combination of these directions) so that a user can see multiple stories clearly at the same time. For example, FIG. 6 shows a perspective view 600 of a three story building with the lowest story active and the upper two stories with a displacement along a horizontal dimension. In another example, FIG. 7 shows a perspective view 700 of a three story building with the middle story active and the other two stories with a displacement along a vertical dimension.

Any separation or displacement of stories described herein may be a fixed amount per story, with the each story being moved such that its position relative to its immediately adjacent stories is increased by this particular displacement. Alternately, the displacement may be variable, and may depend on factors such as the angle at which the user is viewing the model or the size of the stories in the model. Rendering engines such as OpenGL allow 3D models to be easily repositioned.

Figure 8:
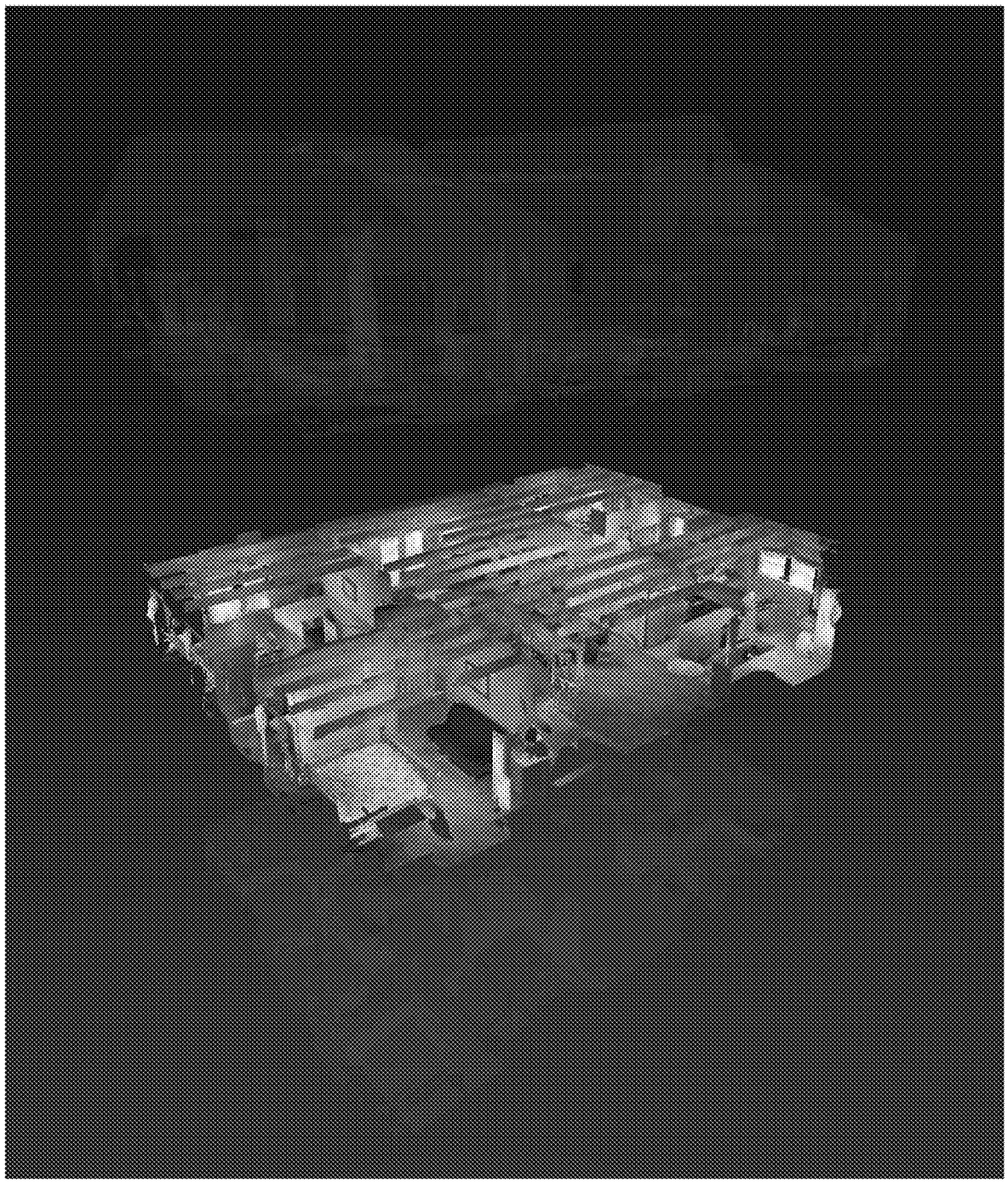
FIG. 8 presents another example graphical user interface that includes a three-dimensional representation of a selected story of a multi-story structure that has been visually called out from three-dimensional representations of other stories of the multi-story structure in accordance with various aspects and embodiments described herein.

In other aspects, interface component 402 can employ combinations of the various techniques described above to call out or otherwise distinguish stories from one another in a separated manner. For example, interface component 402 can separate the different stories by moving the three-dimensional representations apart from one another in a vertical (e.g., Y direction) or horizontal (e.g., X or Z direction) manner. For instance, FIG. 8 shows a perspective view 800 of a three-story building with the middle story active and the other two stories with a displacement along a vertical dimension as well as a "ghosted" rendering with low alpha and desaturated color. In yet another aspect, interface component 402 can rearrange the natural order of the different stories such that the active story is provided above or in front of inactive stories.

With reference back to FIG. 4, multi-story modeling platform 208 can include interaction component 404 to facilitate user interaction and navigation of three-dimensional representations of respective stories of a multi-story structure. For example, interaction component 404 can facilitate receiving user input identifying a story to focus on (e.g., a selected story or active story). For example, interaction component 404 can allow a user to provide input (e.g., via touching the story, clicking on the story with a mouse, stating the name of the story via a verbal command, etc.) indicating a selection of a particular story to view or make active. In response the user input, the interface component 402 can be configured to call out or otherwise distinguish the selected story in one or more of the manners such as the ones discussed above and/or exemplified in FIGS. 5-9.

The active story can be selected by a variety of methods, including but not limited to, clicking on a story included in a ghosted part of the graphical user interface, or clicking on a physically translated story to bring it into focus. In addition, various key commands, user interface controls or gestures can be used to switch between different stories. In an aspect, interface component 402 can generate and include an isometric view mini-model within a small area of the graphical user interface (e.g., the lower right hand side) to use as a make and to click on to select different stories to focus on. In another example, different selectable story names can be included in a menu of the graphical user interface to facilitate selection of a story to focus on. Still in other aspects interactive up/down arrows can be physically displayed on an area of the graphical user interface (e.g., over/under the model in the upper/lower center of screen, in the corner of the screen), etc., to facilitate switching between stories. These controls can also visually indicate which story is active.

In an aspect, the user can select the manner via which to call out or distinguish the selected story. For example, via the graphical user interface, the user can select 'ghosted mode,' 'horizontal separation mode,' 'vertical separation mode,' etc. and interface component 402 can generate the three-dimensional representation of the stories according to the selected mode. Interaction component 404 can also allow the user to rearrange stories in certain modes as displayed via the graphical user interface. For example, interaction component 404 can facilitate moving a new selected story to the top position in vertical separation mode or moving a new selected story to the center position in horizontal separation mode. In an aspect, interaction component 404 can allow the user to scroll through the different stories in either of these modes. This is especially useful when navigating a building that includes many stories (e.g., more than 3, such as a high rise building).

When a story is active they can be seen more clearly by the user, facilitating smooth and easy navigation of the story. For example, interface component 402 can generate a three-dimensional representation corresponding to the active story can and center it and/or enlarge it in a middle area of the graphical user interface. Interaction component 404 can further provide for navigation of the three-dimensional representation corresponding to the active story, such as zooming and rotation, keyed off of the active story. According, the graphical user interface will appear as if a camera generating capturing the three-dimensional representation is centered on active story. In an aspect two or more stories can be active at a time.

Interface component 402 can further generate smooth transitions between selected stories as the user switches from viewing a three-dimensional representation of one story to the next. For example, transitions between active stories can be smooth such that when a user triggers a transition, the newly active story slides gradually into the position occupied by the previously active story, with any changes in rendering for newly active and inactive stories being applied gradually.

In addition to separating the different stories for viewing (e.g., using spatial separation and/or color contrasting techniques described above), interface component 402 can facilitate viewing the three-dimensional representations of the different stories as separated from different perspectives (e.g., in response to user input selection a particular perspective or controlling a virtual camera via which the perspectives are based). In particular, interface component 402 can generate three-dimensional representations of the separated stories from different perspectives (e.g., an orbit perspective, an isometric perspective, an elevation perspective, a floorplan perspective, an interior walking perspective, etc.) to allow for complete viewing and navigating about the stories without occlusion by parts of the other stories. For example, a three-dimensional representation of a story can be viewed from a perspective of a virtual camera positioned at different points outside or inside the three-dimensional representation. Interaction component 404 can also enable a user to select a particular perspective, (e.g., orbit mode, isometric mode, elevation mode, floorplan mode, walking mode) via which to view separated and/or distinguished three-dimensional representations of respective stories of a multi-story structure.

In an aspect, interface component 402 is configured to operate in an exterior perspective mode (e.g., which includes an orbit mode), a floorplan mode, and walking mode. When operating in an exterior perspective mode, interface component 402 is configured to depict the three-dimensional representations of the active story(ies) from a perspective of a virtual camera at points outside of the three-dimensional representations of the active stories. In particular, a three-dimensional representation of a story can be displayed from as an isometric or perspective view from a position of a camera located outside and above the three-dimensional representation of the story and looking down at the story (e.g., at a diagonal) while at least the ceiling of the story is removed or the story is backface-culled for visibility. This perspective is generally referred to as orbit mode. In an aspect, interface component 402 can generate another exterior perspective view of the three-dimensional representation of the story from a position of the camera located outside of the three-dimensional representation of the story at a perpendicular angle or nearly perpendicular angle relative to a wall (e.g., generally the back or front wall) of the three-dimensional representation of the story. This perspective is generally referred to as elevation mode, wherein a user can get the sense of looking into a story from a side of the story with the sidewall removed.

Figure 9:
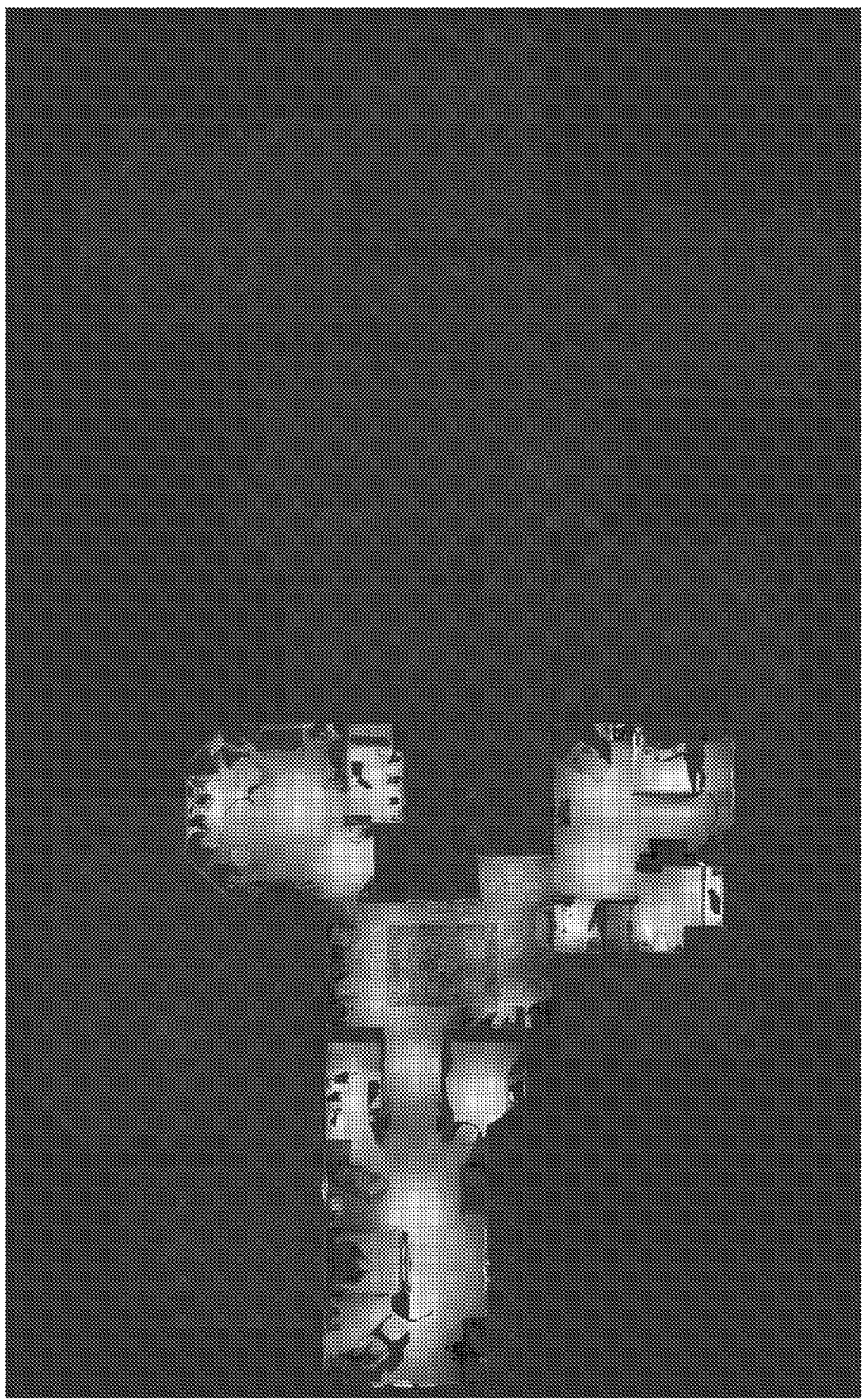
FIG. 9 presents another example graphical user interface that includes a three-dimensional representation of a selected story of a multi-story structure that has been visually called out from three-dimensional representations of other stories of the multi-story structure in accordance with various aspects and embodiments described herein.

When in floor plan mode, interface component 402 is configured to depict the three-dimensional representations of the respective stories from a perspective of the virtual camera at points substantially orthogonally orientated relative to respective horizontal surfaces of the three-dimensional representations of the respective stories. For example, FIG. 9 shows a floorplan view of a two-story building with the upper story distinguished from the lower story of the two-story building by depicting the upper active story in full color and the lower story rendered with low alpha and desaturated color.

When in walking mode, interface component 402 is configured to depict the three-dimensional representations of the respective stories from a perspective of the virtual camera positioned at an approximately consistent distance above inside horizontal surfaces such as stories of the three-dimensional representations of the respective stories.

In an aspect, spatially situated metadata such as measurements, annotations, images, panoramas etc can be attached to a particular story as included/displayed in a graphical interface generated by interface component 402. In an aspect, interface component 402 can be configured to display these features for only the active story(ies).

Users can interact with the model for a variety of reasons, such as selecting a location on the model to make a measurement, add an annotation, or transition to a new viewing mode. The location of the model that the user is selecting may be determined by methods such as ray-casting. This location determination may be done in such a way such that parts of the model that are not on the active story (or stories) are not considered.

Figure 10:
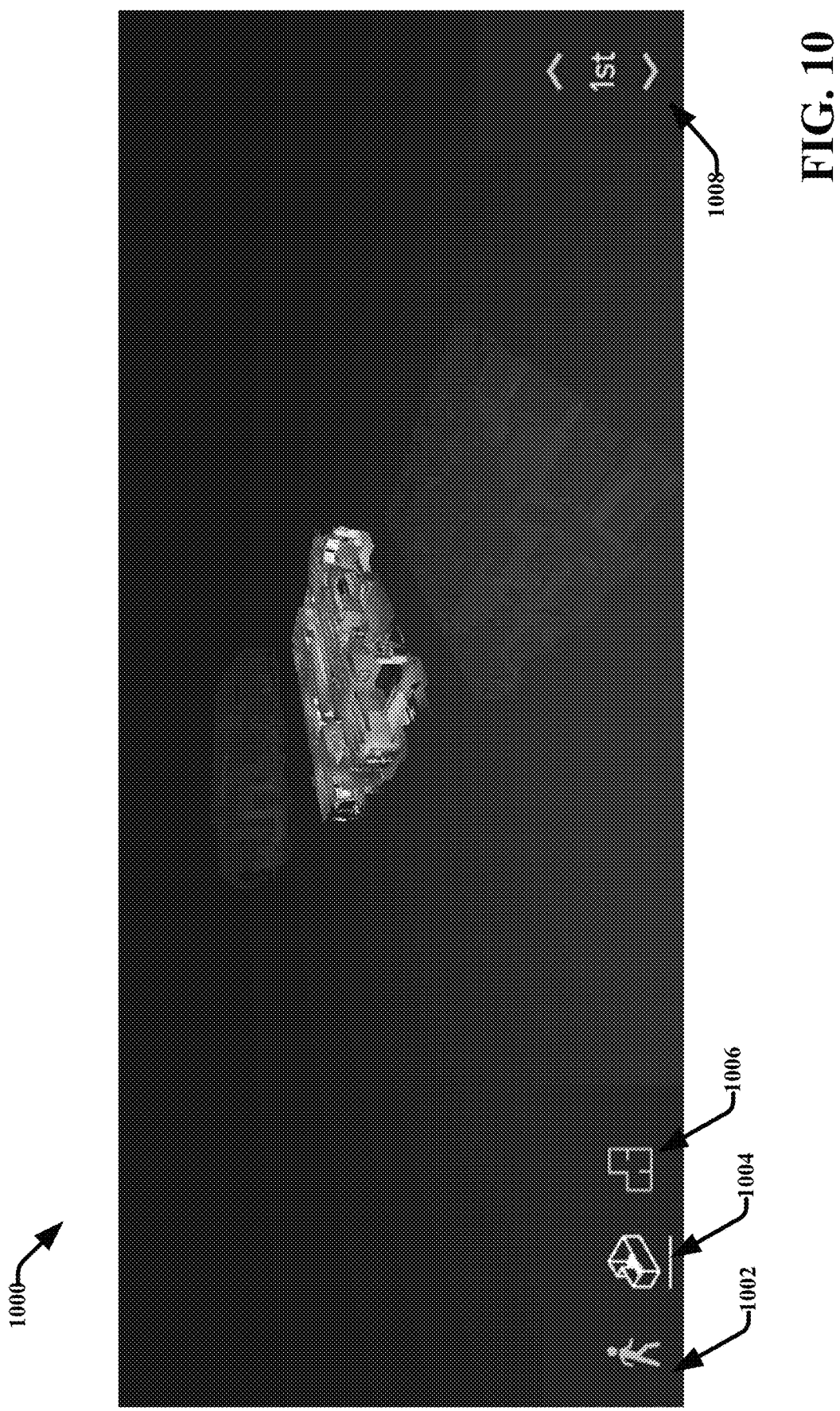
FIG. 10 presents another example graphical user interface that includes a three-dimensional representation of a selected story of a multi-story structure that has been visually called out from three-dimensional representations of other stories of the multi-story structure in accordance with various aspects and embodiments described herein.

FIG. 10 shows a graphical user interface that includes another perspective view 1000 of a three-story building (e.g., building 200) with the active story called out in full color while the other stories are ghosted. The respective stories are also horizontally displaced from one another. In this scenario, the active story is the middle story. The middle story has been positioned in the middle of the screen to accommodate user interaction with the active story and/or to provide further indication that it is the active story.

The interface of FIG. 10 further depicts user controls that facilitate user interaction with the graphical interface. For example, the bottom left corner of the interface includes a walking mode icon 1002, an exterior view icon 1004, and a floorplan view icon 1006. The three-dimensional representations of the separated stories are currently displayed in an exterior view (e.g., an orbit mode). The user can change the view by selecting any of the icons 1002-1006. For example, selection of the walking mode icon can change the perspective of the floor to a walking mode perspective. In another example, selection of the floorplan icon can change the perspective to a floorplan perspective. The interface further includes a control 1008 that facilitates switching between active stories. For example, selection of the up arrow or the down arrow can respectively cause the active story to change to the next floor up or the next story down.

In view of the example systems and/or devices described herein, example methods that can be implemented in accordance with the disclosed subject matter can be further appreciated with reference to the flowcharts in FIGS. 11-14. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a method in accordance with the subject specification. It should be further appreciated that the methods disclosed throughout the subject specification are capable of being stored on an article of manufacture to facilitate transporting and transferring such methods to computers for execution by a processor or for storage in a memory.

Figure 11:
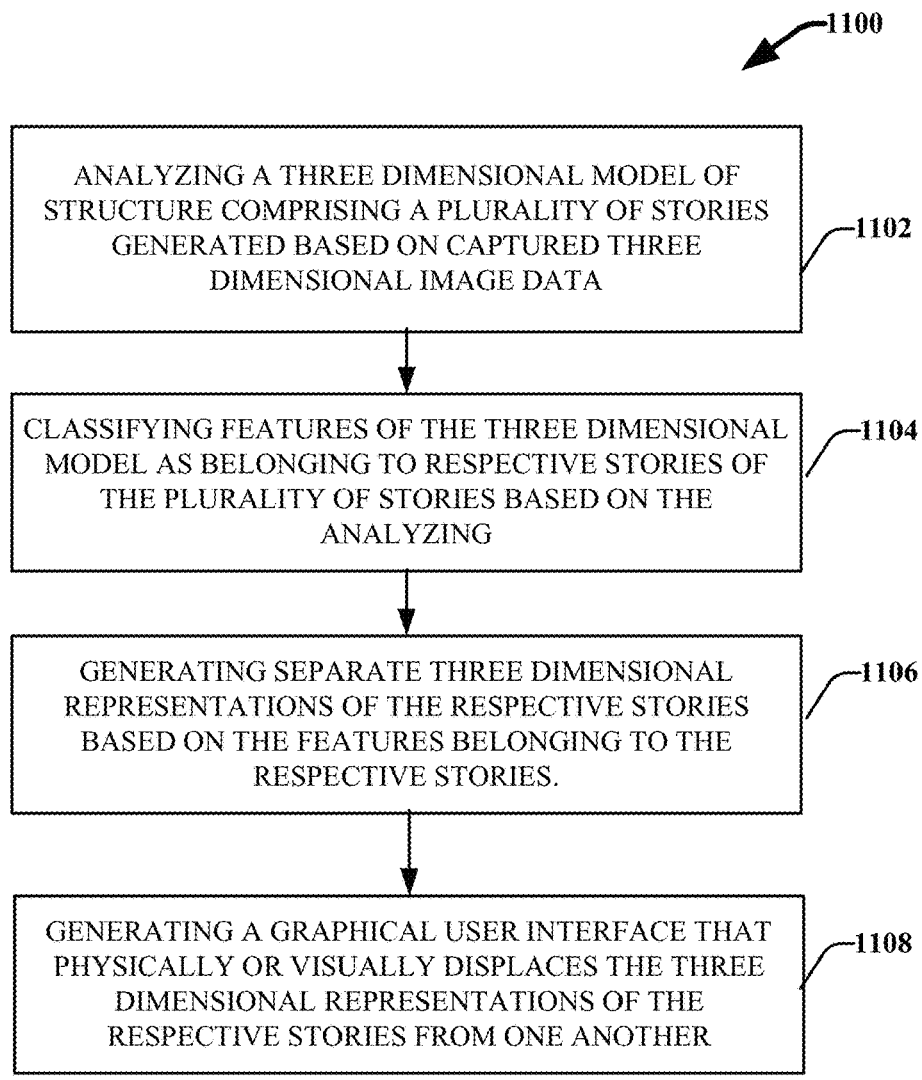
FIG. 11 presents an example process for automatically classifying, separating, and displaying individual stories of a three-dimensional model of a multi-story structure based on captured image data of the multi-story structure in accordance with various aspects and embodiments described herein.

FIG. 11 illustrates a flow chart of an example method 1100 for automatically separating and reconstructing individual stories of a three-dimensional model of a multi-story structure based on captured image data of the multi-story structure in accordance with aspects described herein. At 1102, a three-dimensional model of a structure comprising a plurality of stories generated based on captured three-dimensional image data is analyzed. At 1104, features of the three-dimensional model are classified as belonging to respective stories of the plurality of stories based on the analyzing. At 1106, separate three-dimensional representations of the respective stories are generated based on the features belonging to the respective stories. At 1108, a graphical user interface is generated that physically (e.g., via vertical or horizontal separation) or visually (e.g., via ghosting) separates the three-dimensional representations of the respective stories from one another.

Figure 12:
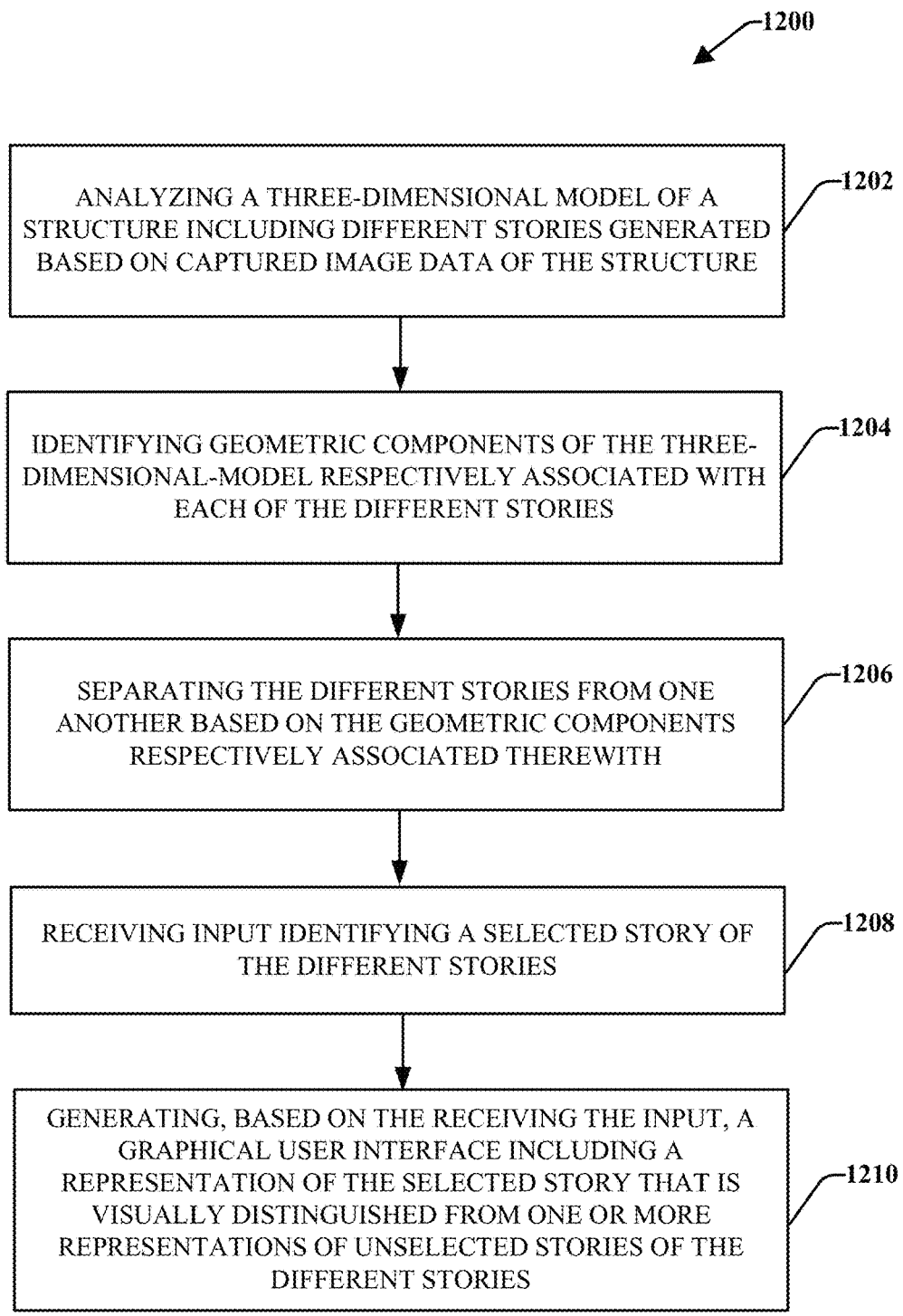
FIG. 12 presents another example process for automatically classifying, separating, and displaying individual stories of a three-dimensional model of a multi-story structure based on captured image data of the multi-story structure in accordance with various aspects and embodiments described herein.

FIG. 12 illustrates a flow chart of another example method 1200 for automatically separating and reconstructing individual stories of a three-dimensional model of a multi-story structure based on captured image data of the multi-story structure in accordance with aspects described herein. In various embodiments, the acts of method 1200 are performed by a device including a processor. Repetitive description of like elements employed in respective embodiments is omitted for sake of brevity.

At 1202, a three-dimensional model of a structure generated based on captured image data of the structure is analyzed. The structure and the three-dimensional model include different stories. At 1204, geometric components of the three-dimensional-model respectively associated with each of the different stories are identified based on the analyzing. For example, the geometric components can include surfaces (e.g., floors, walls, ceilings, table surfaces, etc.). The geometric components can also include polygons, triangles, quads, and/or n-gon, or NURBS. At 1206, the different stories are separated from one another based on the geometric components respectively associated therewith. At 1208, input identifying a selected story of the different stories is received. At 1210, a graphical user interface is generated based on the input that includes a representation of the selected story that is visually distinguished from one or more representations of unselected stories of the different stories. For example, the representation of the selected story can be displayed in the interface in a different color than representation of unselected stories. In another example, representations of the unselected stories can be displayed in a transparent or partially transparent color relative to the representation of the selected story. In yet another example, the representation of the selected story can be physically separated from representation of the unselected stories.

Figure 13:
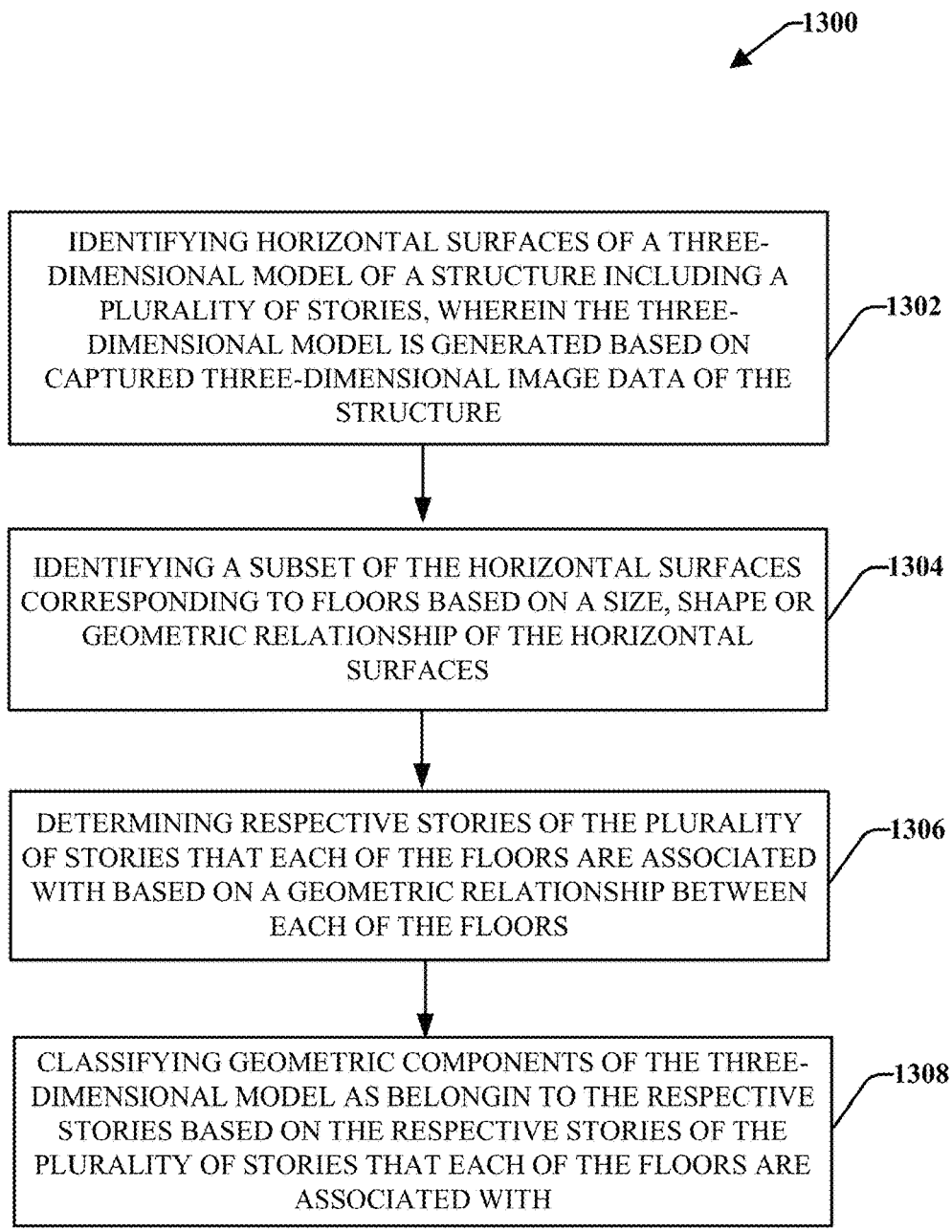
FIG. 13 presents another example process for automatically classifying, separating, and displaying individual stories of a three-dimensional model of a multi-story structure based on captured image data of the multi-story structure in accordance with various aspects and embodiments described herein.

FIG. 13 illustrates a flow chart of another example method 1300 for automatically separating and reconstructing individual stories of a three-dimensional model of a multi-story structure based on captured image data of the multi-story structure in accordance with aspects described herein. In various embodiments, the acts of method 1300 are performed by a device including a processor. Repetitive description of like elements employed in respective embodiments is omitted for sake of brevity.

At 1302, horizontal surfaces of a three-dimensional model of a structure including a plurality of stories are identified, wherein the three-dimensional model is generated based on captured three-dimensional image data of the structure. At 1304, a subset of the horizontal surfaces corresponding to floors is identified based on a size, shape, and/or geometrical relationship of the horizontal surfaces. At 1306, respective stories of the plurality of stories that each of the floors are associated with are determined based on a geometric relationship between each of the floors. At 1308, geometric components of the three-dimensional model are classified as belonging to the respective stories based on the respective stories of the plurality of stories that each of the floors are associated with.

Figure 14:
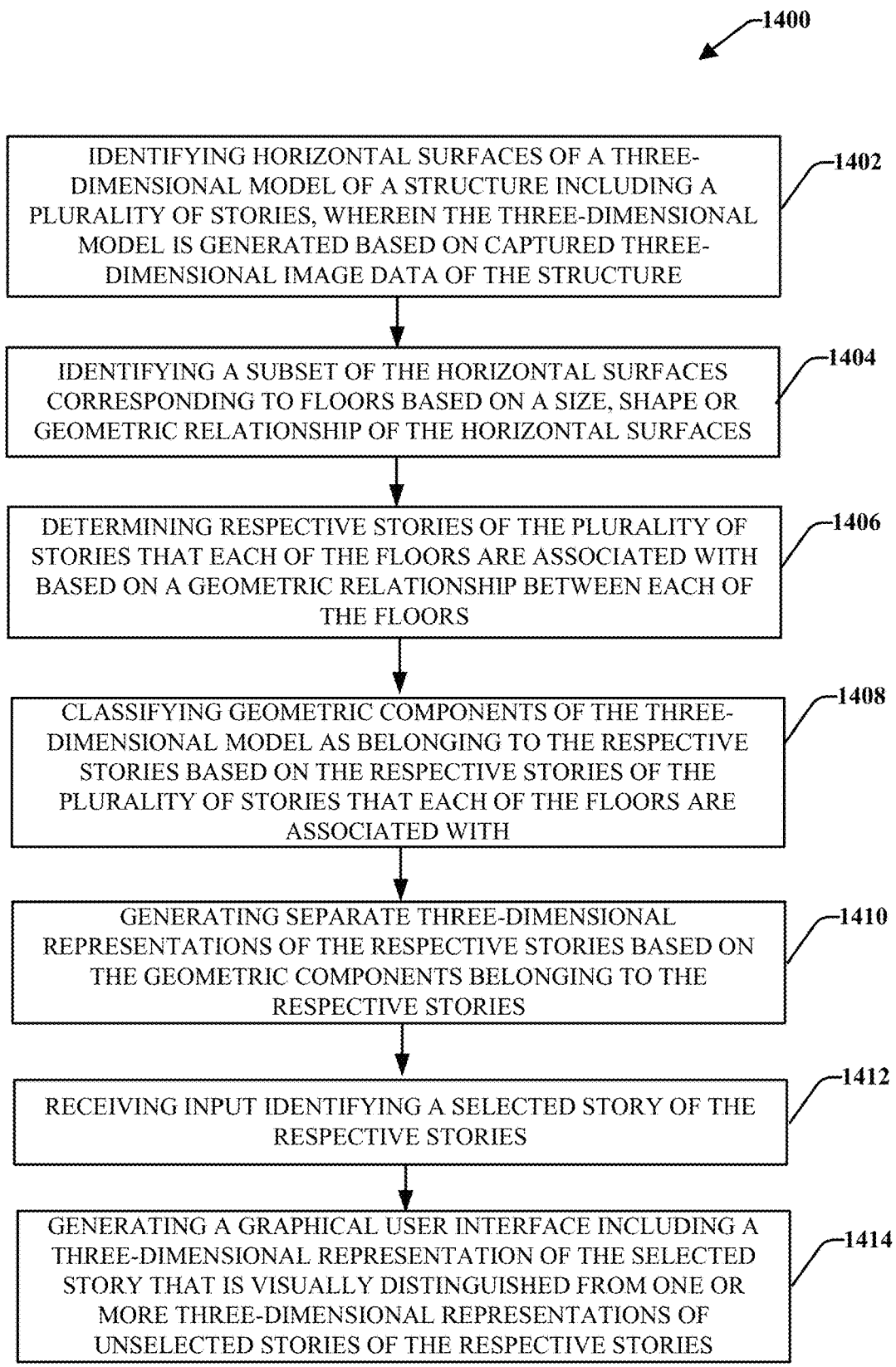
FIG. 14 presents another example process for automatically classifying, separating, and displaying individual stories of a three-dimensional model of a multi-story structure based on captured image data of the multi-story structure in accordance with various aspects and embodiments described herein.

FIG. 14 illustrates a flow chart of another example method 1400 for automatically separating and reconstructing individual stories of a three-dimensional model of a multi-story structure based on captured image data of the multi-story structure in accordance with aspects described herein. In various embodiments, the acts of method 1300 are performed by a device including a processor. Repetitive description of like elements employed in respective embodiments is omitted for sake of brevity.

At 1402, horizontal surfaces of a three-dimensional model of a structure including a plurality of stories are identified, wherein the three-dimensional model is generated based on captured three-dimensional image data of the structure. At 1404, a subset of the horizontal surfaces corresponding to floors is identified based on a size, shape, and/or geometrical relationship of the horizontal surfaces. At 1406, respective stories of the plurality of stories that each of the floors are associated with are determined based on a geometric relationship between each of the floors. At 1408, geometric components of the three-dimensional model are classified as belonging to the respective stories based on the respective stories of the plurality of stories that each of the floors are associated with. At 1410, separate three-dimensional representations of the respective stories are generated based on the geometric components belonging to the respective stories. At 1412, input is received that identifies a selected story of the respective stories. At 1414, a graphical user interface is generated that includes a three-dimensional representation of the selected story that is visually distinguished from one or more three-dimensional representations of unselected stories of the respective stories.

Example Operating Environments

The systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated in this disclosure.

Figure 15:
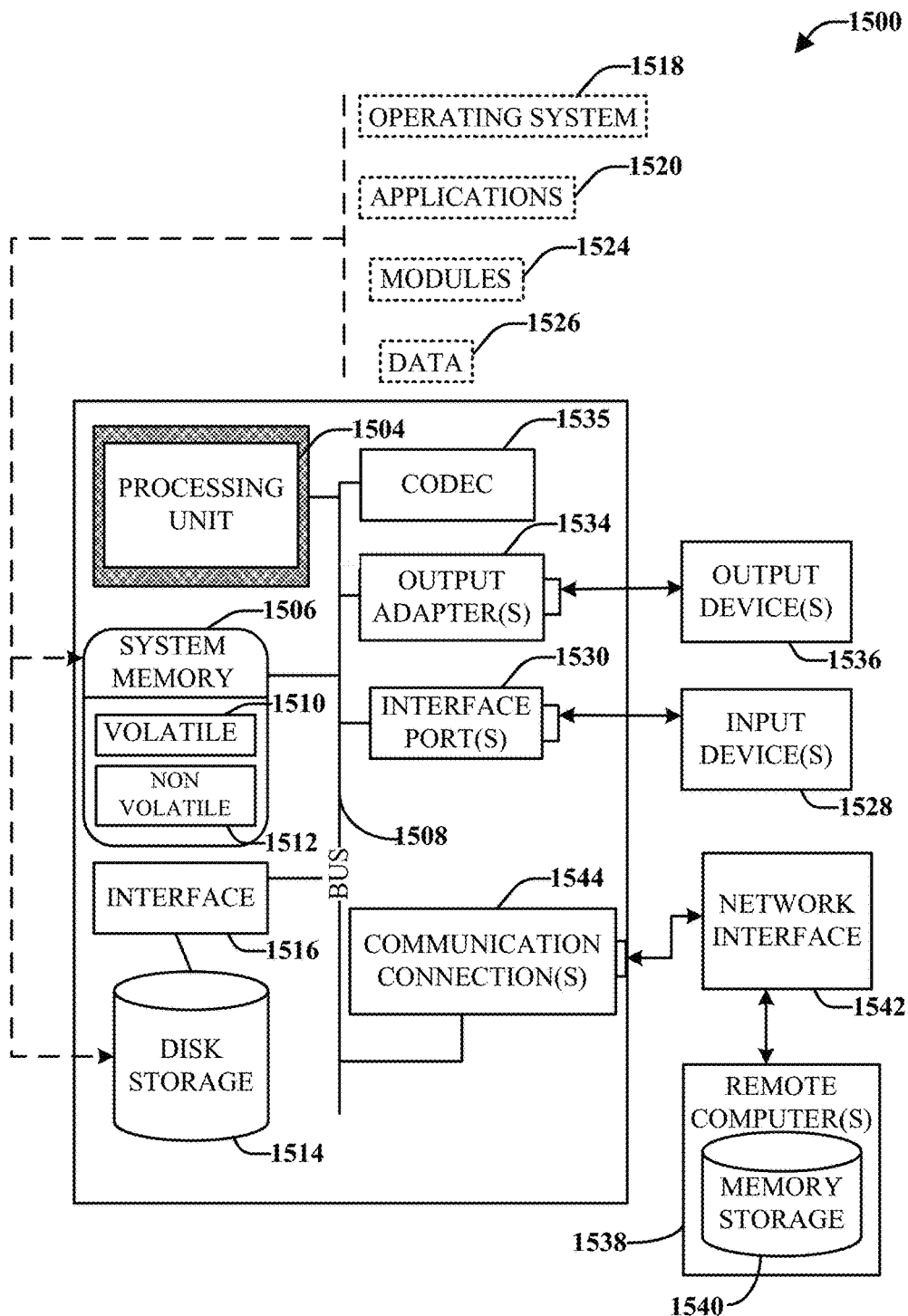
FIG. 15 is a schematic block diagram illustrating a suitable operating environment in accordance with various aspects and embodiments.

With reference to FIG. 15, a suitable environment 1500 for implementing various aspects of the claimed subject matter includes a computer 1502. The computer 1502 includes a processing unit 1504, a system memory 1506, a codec 1505, and a system bus 1508. The system bus 1508 couples system components including, but not limited to, the system memory 1506 to the processing unit 1504. The processing unit 1504 can be any of various available suitable processors. Dual microprocessors and other multiprocessor architectures also can be employed as the processing unit 1504.

The system bus 1508 can be any of several types of suitable bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1506 includes volatile memory 1510 and non-volatile memory 1512. The basic input/output system (BIOS), containing the basic routines to transfer information between elements within the computer 1502, such as during start-up, is stored in non-volatile memory 1512. In addition, according to present innovations, codec 1505 may include at least one of an encoder or decoder, wherein the at least one of an encoder or decoder may consist of hardware, a combination of hardware and software, or software. Although, codec 1505 is depicted as a separate component, codec 1505 may be contained within non-volatile memory 1512. By way of illustration, and not limitation, non-volatile memory 1512 can include read only memory (ROM), programmable ROM (PROM), electrically programmable ROM (EPROM), electrically erasable programmable ROM (EEPROM), or flash memory. Volatile memory 1510 includes random access memory (RAM), which acts as external cache memory. According to present aspects, the volatile memory may store the write operation retry logic (not shown in FIG. 15) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1502 may also include removable/non-removable, volatile/non-volatile computer storage medium. FIG. 15 illustrates, for example, disk storage 1514. Disk storage 1514 includes, but is not limited to, devices like a magnetic disk drive, solid state disk (SSD) floppy disk drive, tape drive, Jaz drive, Zip drive, LS-70 drive, flash memory card, or memory stick. In addition, disk storage 1514 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1514 to the system bus 1508, a removable or non-removable interface is typically used, such as interface 1516.

It is to be appreciated that FIG. 15 describes software that acts as an intermediary between users and the basic computer resources described in the suitable operating environment 1500. Such software includes an operating system 1518. Operating system 1518, which can be stored on disk storage 1514, acts to control and allocate resources of the computer system 1502. Applications 1520 take advantage of the management of resources by operating system 1518 through program modules 1524, and program data 1526, such as the boot/shutdown transaction table and the like, stored either in system memory 1506 or on disk storage 1514. It is to be appreciated that the claimed subject matter can be implemented with various operating systems or combinations of operating systems.

A user enters commands or information into the computer 1502 through input device(s) 1528. Input devices 1528 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via interface port(s) 1540. Interface port(s) 1540 include, for example, a serial port, a parallel port, a game port, and a universal serial bus (USB). Output device(s) 1546 use some of the same type of ports as input device(s). Thus, for example, a USB port may be used to provide input to computer 1502, and to output information from computer 1502 to an output device 1546. Output adapter 1544 is provided to illustrate that there are some output devices 1546 like monitors, speakers, and printers, among other output devices 1546, which require special adapters. The output adapters 1544 include, by way of illustration and not limitation, video and sound cards that provide a means of connection between the output device 1546 and the system bus 1508. It should be noted that other devices and/or systems of devices provide both input and output capabilities such as remote computer(s) 1548.

Computer 1502 can operate in a networked environment using logical connections to one or more remote computers, such as remote computer(s) 1548. The remote computer(s) 1548 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1540 is illustrated with remote computer(s) 1548. Remote computer(s) 1548 is logically connected to computer 1502 through a network interface 1542 and then connected via communication connection(s) 1544. Network interface 1542 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1544 refers to the hardware/software employed to connect the network interface 1542 to the bus 1508. While communication connection 1544 is shown for illustrative clarity inside computer 1502, it can also be external to computer 1502. The hardware/software necessary for connection to the network interface 1542 includes, for exemplary purposes only, internal and external technologies such as, modems including regular telephone grade modems, cable modems and DSL modems, ISDN adapters, and wired and wireless Ethernet cards, hubs, and routers.

Figure 16:
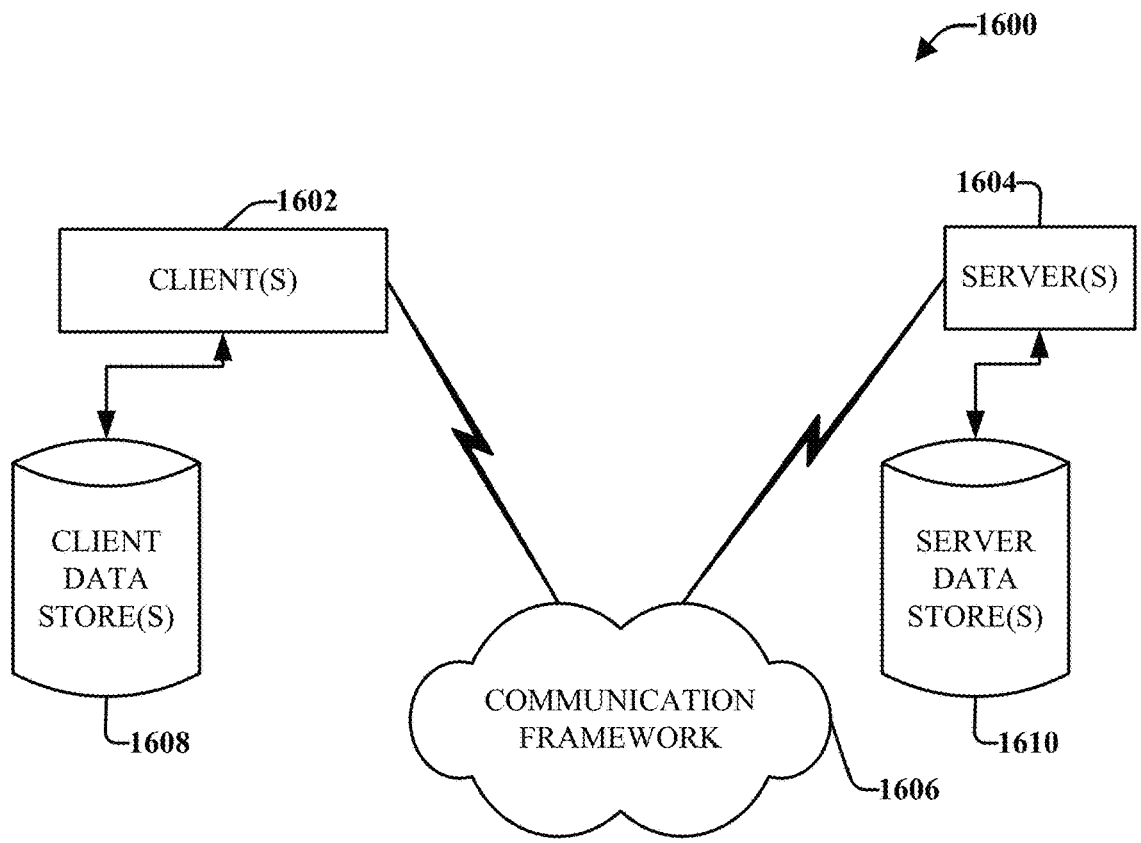
FIG. 16 is a schematic block diagram of a sample-computing environment in accordance with various aspects and embodiments.

Referring now to FIG. 16, there is illustrated a schematic block diagram of a computing environment 1600 in accordance with this disclosure. The system 1600 includes one or more client(s) 1602 (e.g., laptops, smart phones, PDAs, media players, computers, portable electronic devices, tablets, and the like). The client(s) 1602 can be hardware and/or software (e.g., threads, processes, computing devices). The system 1600 also includes one or more server(s) 1604. The server(s) 1604 can also be hardware or hardware in combination with software (e.g., threads, processes, computing devices). The servers 1604 can house threads to perform transformations by employing aspects of this disclosure, for example. One possible communication between a client 1602 and a server 1604 can be in the form of a data packet transmitted between two or more computer processes wherein the data packet may include video data. The data packet can include a metadata, e.g., associated contextual information, for example. The system 1600 includes a communication framework 1606 (e.g., a global communication network such as the Internet, or mobile network(s)) that can be employed to facilitate communications between the client(s) 1602 and the server(s) 1604.

Communications can be facilitated via a wired (including optical fiber) and/or wireless technology. The client(s) 1602 include or are operatively connected to one or more client data store(s) 1608 that can be employed to store information local to the client(s) 1602 (e.g., associated contextual information). Similarly, the server(s) 1604 are operatively include or are operatively connected to one or more server data store(s) 1610 that can be employed to store information local to the servers 1604.

In one embodiment, a client 1602 can transfer an encoded file, in accordance with the disclosed subject matter, to server 1604. Server 1604 can store the file, decode the file, or transmit the file to another client 1602. It is to be appreciated, that a client 1602 can also transfer uncompressed file to a server 1604 and server 1604 can compress the file in accordance with the disclosed subject matter. Likewise, server 1604 can encode video information and transmit the information via communication framework 1606 to one or more clients 1602.

The illustrated aspects of the disclosure may also be practiced in distributed computing environments where certain tasks are performed by remote processing devices that are linked through a communications network. In a distributed computing environment, program modules can be located in both local and remote memory storage devices.

Moreover, it is to be appreciated that various components described in this description can include electrical circuit(s) that can include components and circuitry elements of suitable value in order to implement the embodiments of the subject innovation(s). Furthermore, it can be appreciated that many of the various components can be implemented on one or more integrated circuit (IC) chips. For example, in one embodiment, a set of components can be implemented in a single IC chip. In other embodiments, one or more of respective components are fabricated or implemented on separate IC chips.

What has been described above includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described in this disclosure for illustrative purposes, various modifications are possible that are considered within the scope of such embodiments and examples, as those skilled in the relevant art can recognize.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the disclosure illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned systems/circuits/modules have been described with respect to interaction between several components/blocks. It can be appreciated that such systems/circuits and components/blocks can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described in this disclosure may also interact with one or more other components not specifically described in this disclosure but known by those of skill in the art.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer readable storage medium; software transmitted on a computer readable transmission medium; or a combination thereof.

Moreover, the words "example" or "exemplary" are used in this disclosure to mean serving as an example, instance, or illustration. Any aspect or design described in this disclosure as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Computing devices typically include a variety of media, which can include computer-readable storage media and/or communications media, in which these two terms are used in this description differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal that can be transitory such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

In view of the exemplary systems described above, methodologies that may be implemented in accordance with the described subject matter will be better appreciated with reference to the flowcharts of the various figures. For simplicity of explanation, the methodologies are depicted and described as a series of acts. However, acts in accordance with this disclosure can occur in various orders and/or concurrently, and with other acts not presented and described in this disclosure. Furthermore, not all illustrated acts may be required to implement the methodologies in accordance with certain aspects of this disclosure. In addition, those skilled in the art will understand and appreciate that the methodologies could alternatively be represented as a series of interrelated states via a state diagram or events. Additionally, it should be appreciated that the methodologies disclosed in this disclosure are capable of being stored on an article of manufacture to facilitate transporting and transferring such methodologies to computing devices. The term article of manufacture, as used in this disclosure, is intended to encompass a computer program accessible from a computer-readable device or storage media.

What is claimed is:

1. A system, comprising:
a memory that stores computer executable components;
a processor that executes at least the following computer executable components stored in the memory:
an analysis component configured to analyze a three-dimensional model of a structure comprising different stories generated based on captured three-dimensional image data of the structure, and identify features of the three-dimensional model respectively associated with each of the different stories, wherein the features comprise at least floors and walls;
a grouping component configured to group the respective features into the different stories and to group a plurality of represented objects of the three-dimensional model of the structure based on location of each of the plurality of represented objects within the different stories
a separation component configured to separate the different stories from one another into different data objects, the separation component configured to separate the different stories based on the respective grouping of the features, each represented object being associated with at least one data object based on grouping
an interface component configured to generate a graphical user interface that facilitates viewing representations of the different stories as visually distinguished from one another;
an interaction component configured to receive input identifying a selected story of the different stories, wherein in response to the input, the interface component is configured to, using an associated data object, facilitate display of a representation of the selected story in the graphical user interface such that it is visually distinguished from one or more representations of unselected stories of the different stories, the representation of selected story including one or more represented objects associated with the selected story; and
a presentation component configured to present the graphical user interface to a display device.

2. The system of claim 1, wherein the features further comprise surfaces of the three-dimensional model, including at least one of structural components, fixtures, or, ceilings.

3. The system of claim 1, wherein the three-dimensional model includes a three-dimensional mesh and the features comprise components of the three-dimensional mesh, including at least one of: polygons, triangles, quads, and/or n-gon, or non-uniform rational basis splines (NURBS).

4. The system of claim 1, wherein the analysis component is configured to identify the features of the three-dimensional model respectively associated with each of the different stories by:
identifying horizontal surfaces of the three-dimensional model;
identifying a subset of the horizontal surfaces corresponding to floors based on a size, shape or geometric relationship of the horizontal surfaces;
determining respective stories of the different stories that each of the floors are associated with based on a geometric relationship between each of the floors; and
ordering the stories based on a geometric relationship between the respective floors.

5. The system of claim 1, wherein the interface component is configured to visually distinguish the representation of the selected story in the graphical user interface by excluding at least one of the representations of the unselected stories from the graphical user interface.

6. The system of claim 1, wherein the interface component is configured to visually distinguish the representation of the selected story in the graphical user interface by displaying the representation of the selected story in a different color relative to the one or more representations of the unselected stories.

7. The system of claim 1, wherein the interface component is further configured to visually distinguish the representation of the selected story in the graphical user interface by causing the one or more representations of the unselected stories to appear transparent or partially transparent.

8. The system of claim 1, wherein the interface component is configured to visually distinguish the representation of the selected story in the graphical user interface by facilitating a display of a physical separation of the representation of the selected story from the one or more representations of the unselected stories along a vertical dimension.

9. The system of claim 1, wherein the representations of the different stories are three-dimensional, and wherein the interface component is configured to include the representations of the different stories in the graphical user interface and visually distinguish the representations from one another, and wherein the interface component is configured to render the graphical user interface from different perspectives of a virtual camera, including:
an orbit mode that enables depiction of the representations of the different stories from a perspective of the virtual camera at points outside of the representations of the different stories.

10. The system of claim 9, wherein during the orbit mode, the interface component employs backface culling or a ceiling removal technique to generate the representation of a selected story at a perspective of an interior space of the representation from a point outside of the representation.

11. The system of claim 1, wherein the representations of the different stories are three-dimensional, and wherein the interface component is configured to include the representations of the different stories in the graphical user interface and visually distinguish the representations from one another, and wherein the interface component is configured to render the graphical user interface from different perspectives of a virtual camera, including:
a floor plan mode that enables depiction of the representations of the different stories from a perspective of the virtual camera at points substantially orthogonally oriented relative to respective horizontal surfaces of the representations of the different stories.

12. The system of claim 1, wherein the representations of the different stories are three-dimensional and, wherein the interface component is configured to include the representations of the different stories in the graphical user interface and visually distinguish the representations from one another, and wherein the interface component is configured to render the graphical user interface from different perspectives of a virtual camera, including:
a walking mode that enables depiction of the representations of the different stories from a perspective of the virtual camera positioned at an approximately consistent distance relative to surfaces associated with floors of the representations of the different stories.

13. The system of claim 1, wherein the interface component employs backface culling or a ceiling removal technique to distinguish the representation of the selected story from the one or more representations of the unselected stories.

14. The system of claim 1, wherein the representation of the selected story is three-dimensional and the interaction component facilitates navigating about the representation of the selected story from different positions of a virtual camera relative to the representation of the selected story.

15. The system of claim 1, wherein the interaction component facilitates switching viewing and navigating between the representations of the different stories.

16. The system of claim 1, wherein the interaction component further facilitates at least one of: selecting a feature from the representation of the selected story, measuring the feature, adding an annotation to the feature, removing the feature, or changing the feature.

17. A method comprising:
analyzing, by a system comprising a processor, geometric components of a three-dimensional model of a structure comprising a plurality of stories generated based on captured three-dimensional image data of the structure, wherein the analyzing comprises:
identifying horizontal surfaces of the three-dimensional model,
identifying a subset of the horizontal surfaces corresponding to floors based on a size, shape or geometric relationship of the horizontal surfaces, and
determining respective stories of the plurality of stories that each of the floors are associated with based on a geometric relationship between each of the floors;
grouping, by the system, respective geometric components of the three-dimensional model into stories of the plurality of stories based on the analyzing;
grouping, by the system, a plurality of represented objects of the three-dimensional model of the structure based on location of each of the plurality of represented objects within different stories, wherein the geometric components correspond at least to the floors and to walls;
generating, by the system, separate three-dimensional representations of the respective stories into different data objects, the generating separate three-dimensional representations of the respective stories being based on the geometric components belonging to the respective stories, each represented object being associated with at least one data object based on the grouping
receiving, by the system, input identifying a selected story of the respective stories;
in response to receiving the input, generating, by the system, a graphical user interface including a three-dimensional representation of the selected story using an associated data object, the three-dimensional representation of the selected story being visually distinguished from one or more three-dimensional representations of unselected stories of the respective stories, the represented of the selected story including one or more represented objects associated with the selected story; and
presenting, by the system, the graphical user interface to a device display.

18. The method of claim 17, further comprising:
ordering, by the system, the respective stories based on a geometric relationship between the floors.

19. The method of claim 17, wherein the geometric components comprise at least one of: polygons, triangles, quads, and/or n-gon, or non-uniform rational basis splines (NURBS).

20. The method of claim 17, further comprising: grouping, by the system, the geometric components corresponding to structural components and fixtures, of the three-dimensional representation as belonging to the respective stories based on the analyzing.

21. The method of claim 17, wherein the analyzing further comprises:

clustering subsets of the horizontal surfaces into clusters based on a size, shape or geometric relationship of the horizontal surfaces, and
determining respective clusters of the clusters that are associated with the respective stories based on a geometric relationship between the clusters.

22. The method of claim 21, wherein the analyzing further comprises:
identifying non-horizontal surfaces of the three-dimensional model, and
determining subsets of the non-horizontal surfaces respectively associated with the respective stories based on a geometric relationship between the subsets of the non-horizontal surfaces and the subsets of the horizontal surfaces respectively associated with each of the clusters.

23. The method of claim 17, wherein the generating the graphical user interface comprises:
causing the one or more three-dimensional representations of the unselected stories to appear transparent or partially transparent relative to the three-dimensional representation of the selected story.

24. The method of claim 17 further comprising switching viewing and navigating between the three-dimensional representations of the respective stories based on receiving input.

25. A computer readable storage device comprising executable instructions that, in response to execution, cause a device comprising a professor to perform operations, comprising:
analyzing a three-dimensional model of a structure comprising different stories generated based on captured image data of the structure;
identifying geometric components of the three-dimensional model respectively associated with each of the different stories, wherein the geometric components correspond at least to floors and walls;
classifying respective geometric components into the different stories;
grouping a plurality of represented objects of the three-dimensional model of the structure based on location of each of the plurality of represented objects within the different stories;
separating the different stories from one another into different data objects, the separating the different stories from one another being based on the respective groupings of the geometric components, each represented object being associated with at least one data object based on the grouping
receiving input identifying a selected story of the different stories;
generating, based on the receiving the input, a graphical user interface comprising a representation of the selected story using an associated data object, the representation of the selected story being visually distinguished from one or more representations of unselected stories of the different stories, the representation of the selected story including one or more represented objects associated with the selected story; and
presenting the graphical user interface to a device display.

26. The computer readable storage device of claim 25, the operations further comprising grouping the geometric components corresponding to structural components and fixtures of the three-dimensional representation as belonging to the respective stories based on the analyzing.

27. The computer readable storage device of claim 25, wherein the geometric components comprise at least one of:

polygons, triangles, quads, and/or n-gon, or non-uniform rational basis splines (NURBS).

28. The computer readable storage device of claim 25, wherein the identifying the geometric components comprises:
   identifying horizontal surfaces of the three-dimensional model;
   identifying a subset of the horizontal surfaces corresponding to floors based on a size, shape or geometric relationship of the horizontal surfaces;
   determining respective stories of the different stories that each of the floors are associated with based on a geometric relationship between each of the floors; and
   ordering the stories based on a geometric relationship between the floors.

29. The computer readable storage device of claim 25, wherein generating further comprises:
   causing the one or more representations of the unselected stories to appear transparent or partially transparent relative to the representation of the selected story.

30. The computer readable storage device of claim 25, the operations further comprising switching viewing and navigating between the representations of the different stories based on receiving additional input.

31. The computer readable storage device of claim 25, the operations further comprising at least one of: selecting a geometric component from the representation of the selected story, measuring the geometric component, adding an annotation to the geometric component, removing the geometric component, or changing the geometric component.

* * * * *